United States Patent
Shibuya et al.

[11] Patent Number: 5,891,806
[45] Date of Patent: Apr. 6, 1999

[54] PROXIMITY-TYPE MICROLITHOGRAPHY APPARATUS AND METHOD

[75] Inventors: Masato Shibuya, Ohmiya; Keiichiro Sakato, Kawasaki; Akira Miyaji, Tokyo; Toshiyuki Namikawa, Kamagaya; Takashi Mori, Kawasaki, all of Japan

[73] Assignee: Nikon Corporation, Tokyo, Japan

[21] Appl. No.: 842,897

[22] Filed: Apr. 17, 1997

[30] Foreign Application Priority Data

Apr. 22, 1996 [JP] Japan .................................... 8-124078
Jun. 10, 1996 [JP] Japan .................................... 8-147020
Jun. 19, 1996 [JP] Japan .................................... 8-158691

[51] Int. Cl.$^6$ ................................................. H01L 21/00
[52] U.S. Cl. ............................ 438/707; 216/66; 355/66; 355/67; 438/942
[58] Field of Search .................................. 216/41, 48, 65, 216/66; 355/66, 67; 438/707, 725, 746, 942, 943, 947, 948; 430/5, 8, 311, 313

[56] References Cited

U.S. PATENT DOCUMENTS 4,294,538 10/1981 Ban .
5,425,848 6/1995 Haisma et al. ............................ 216/48
5,759,423 6/1998 Sohda et al. ............................. 216/66

*Primary Examiner*—William Powell
*Attorney, Agent, or Firm*—Klarquist Sparkman Campbell Leigh & Whinston, LLP

[57] ABSTRACT

Apparatus and methods are disclosed for increasing the illuminance at a mask used for proximity-type microlithography and for achieving increases in throughput. A mask defining a pattern is illuminated by an illumination optical system. The pattern is transferred to a workpiece separated from the mask by a prescribed standoff. The mask and workpiece can be relatively moved in a scan direction. With respect to the illumination optical system, the workpiece-side numerical aperture in a first direction on the plane of the mask is different from the workpiece-side numerical aperture in a second direction, perpendicular to the first direction, on the plane of the mask. A reflective-type relay optical system can be included that comprises first and second spherical mirrors that do not produce chromatic aberrations.

40 Claims, 15 Drawing Sheets

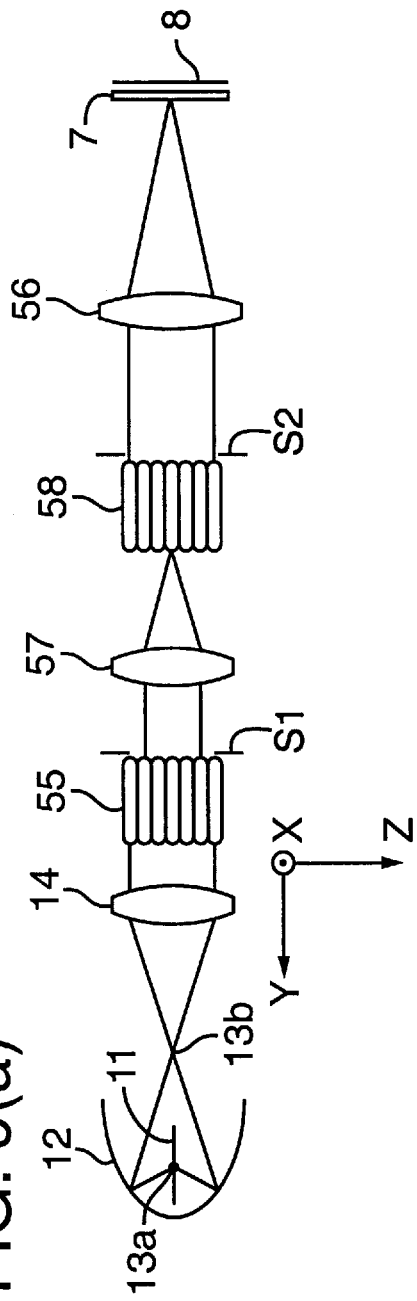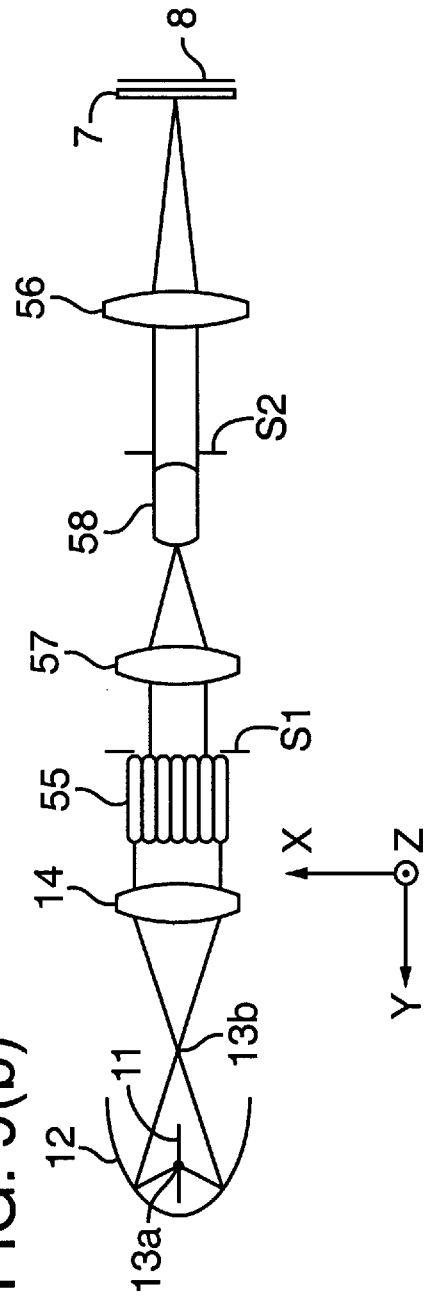

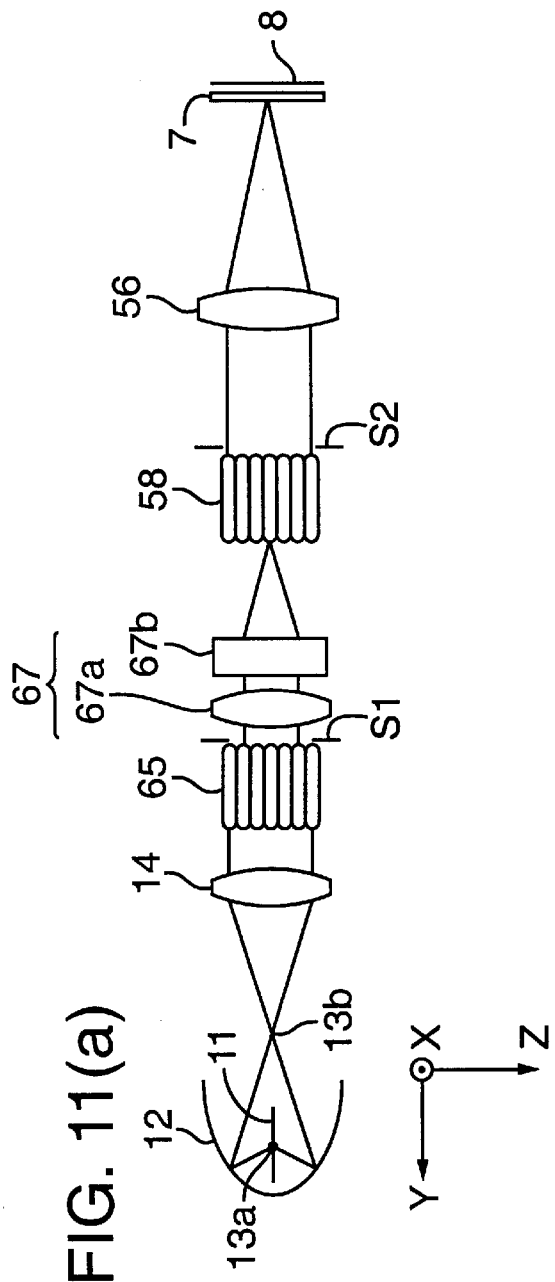
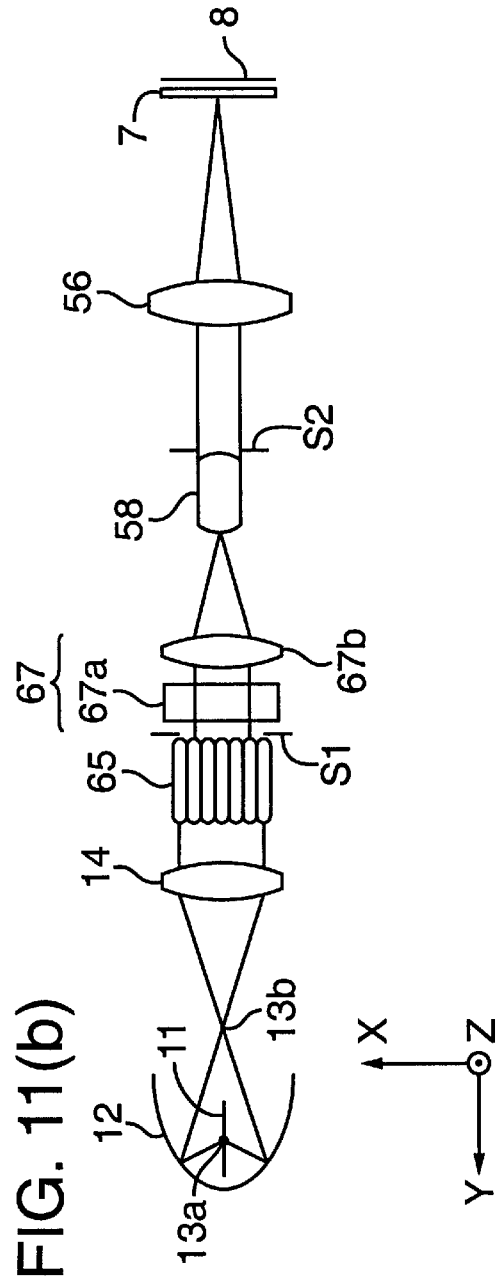

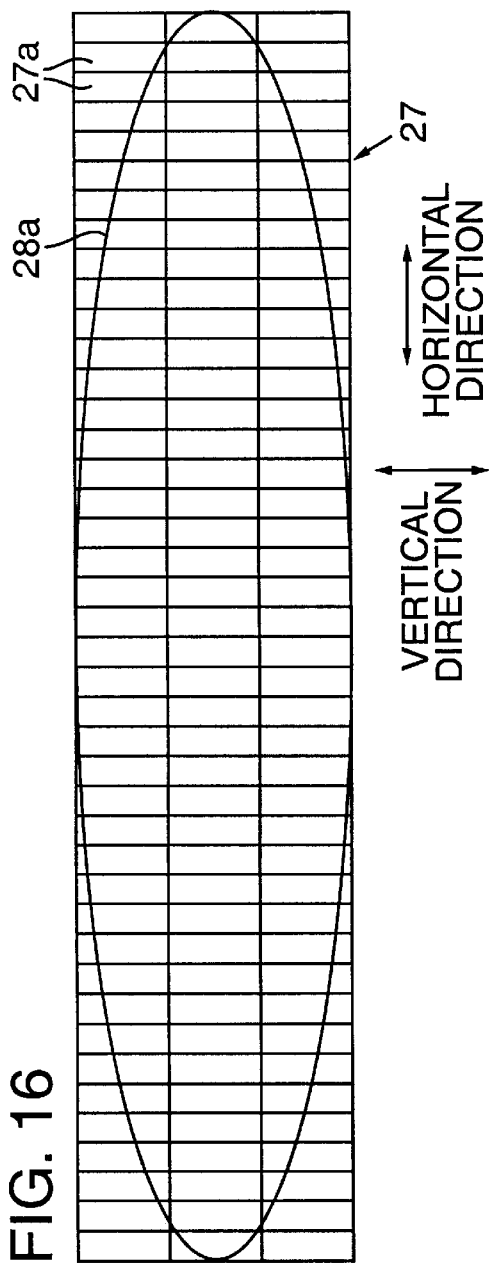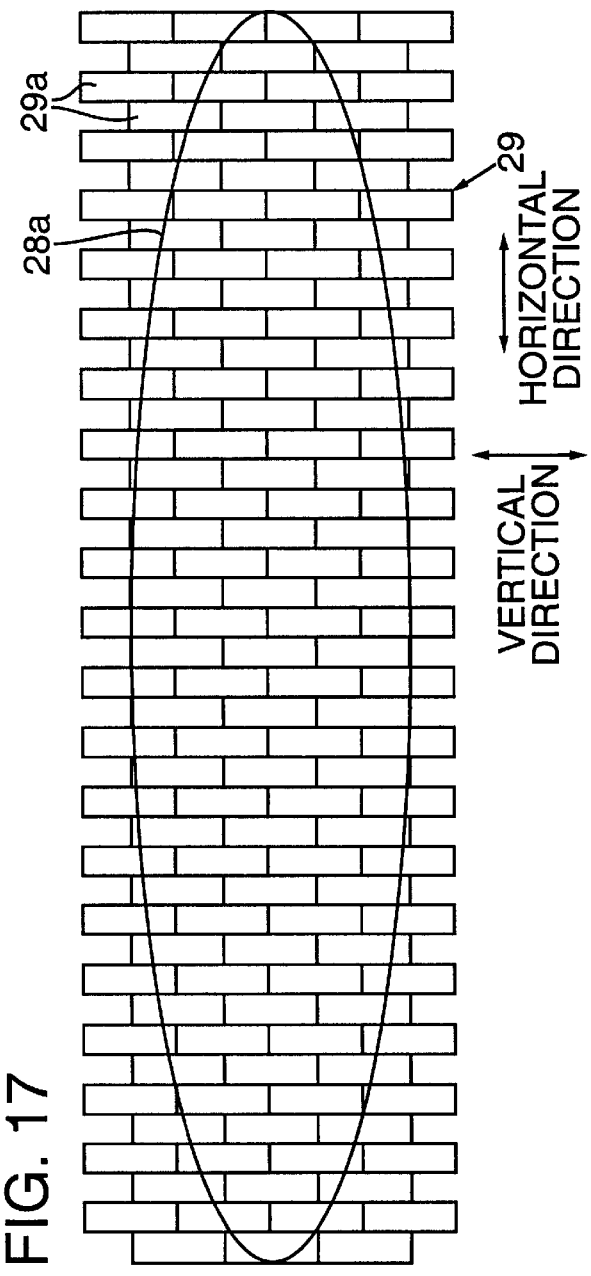
FIG. 16
FIG. 17

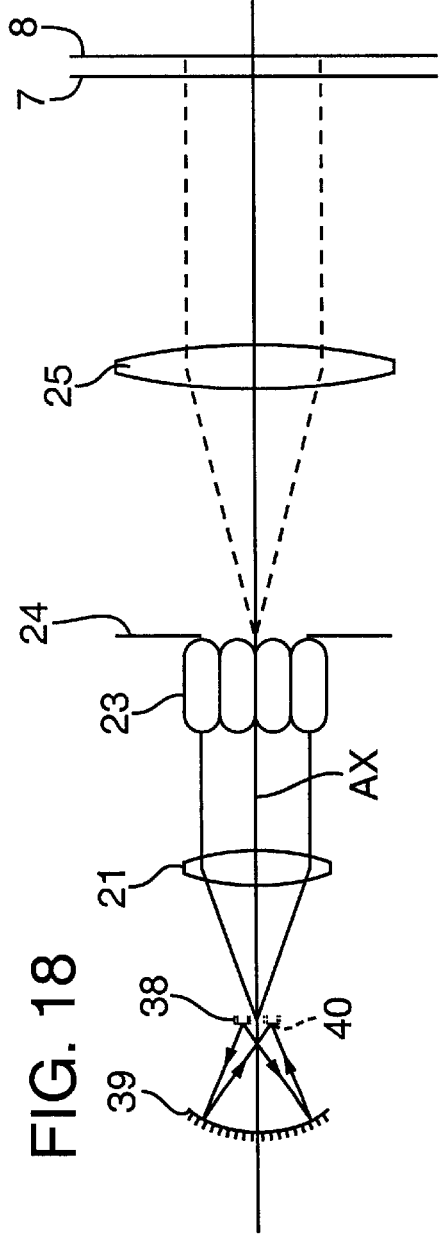
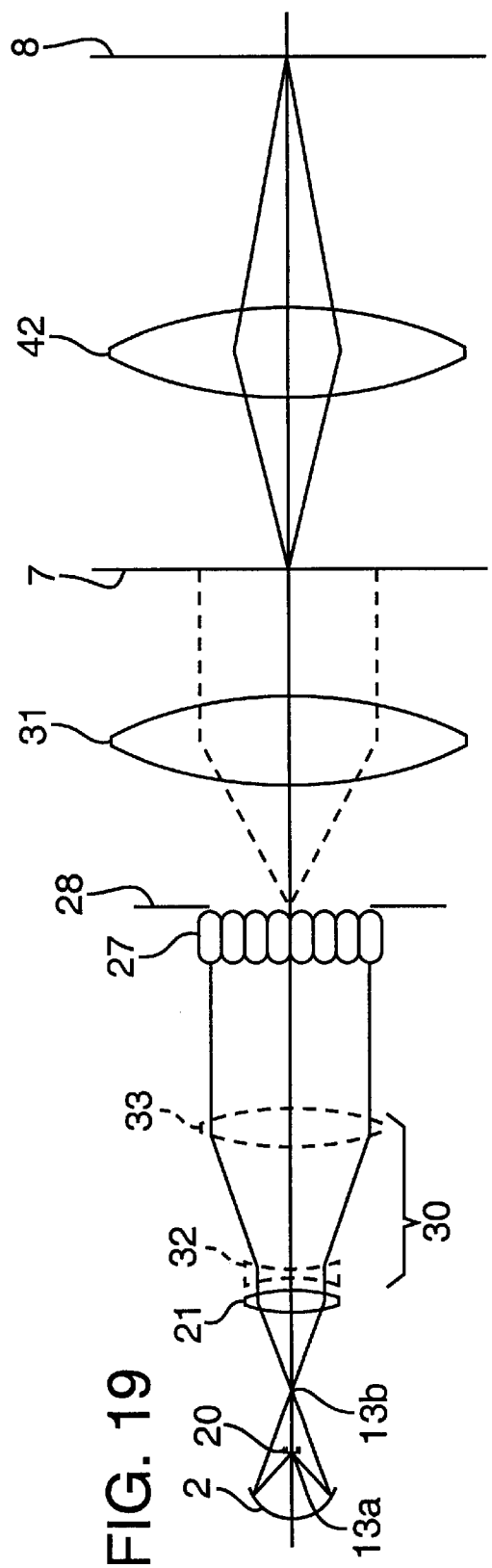

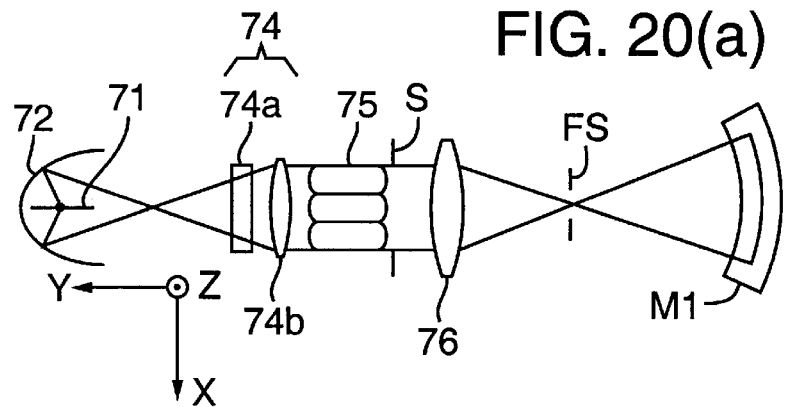
FIG. 20(a)
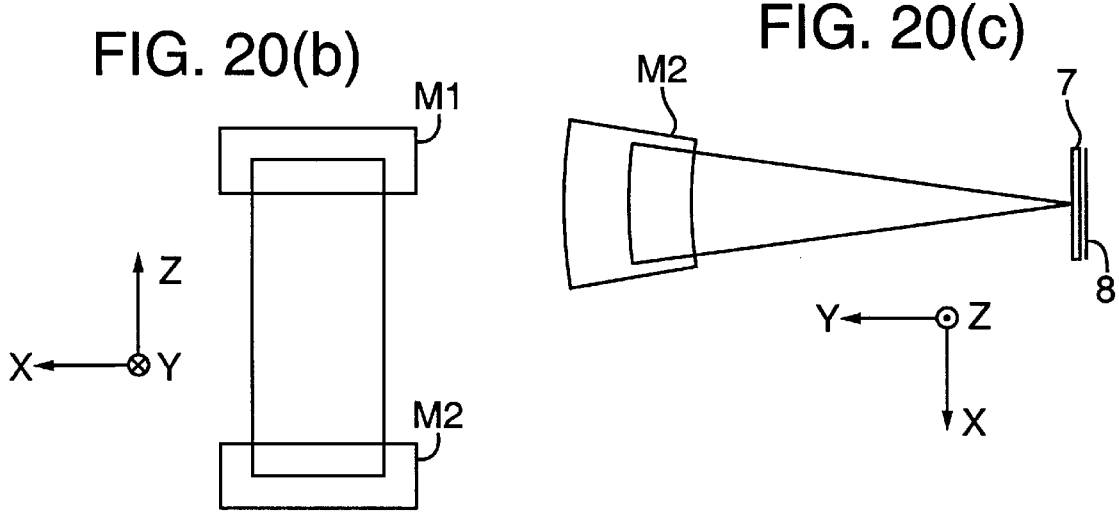
FIG. 20(b)
FIG. 20(c)
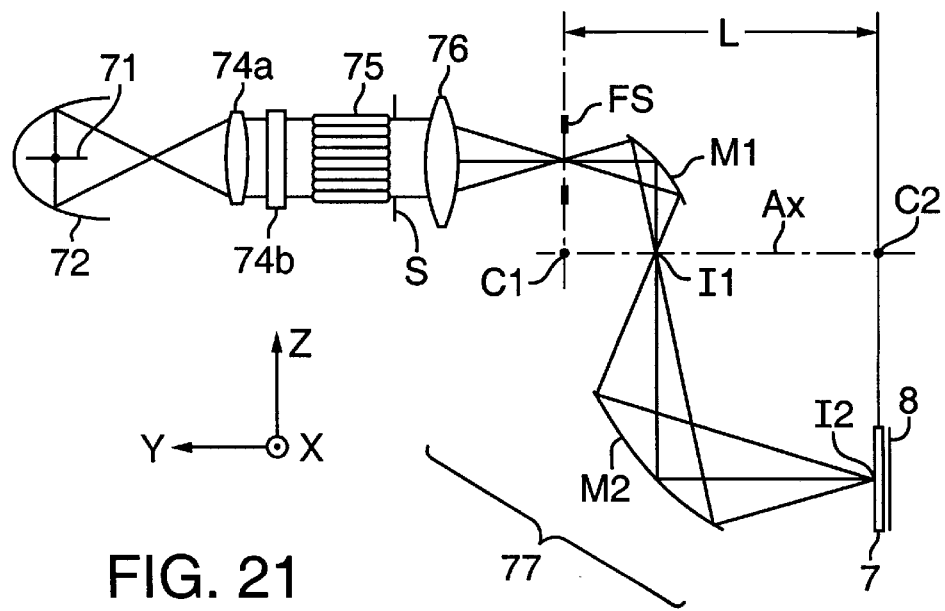
FIG. 21

FIG. 26
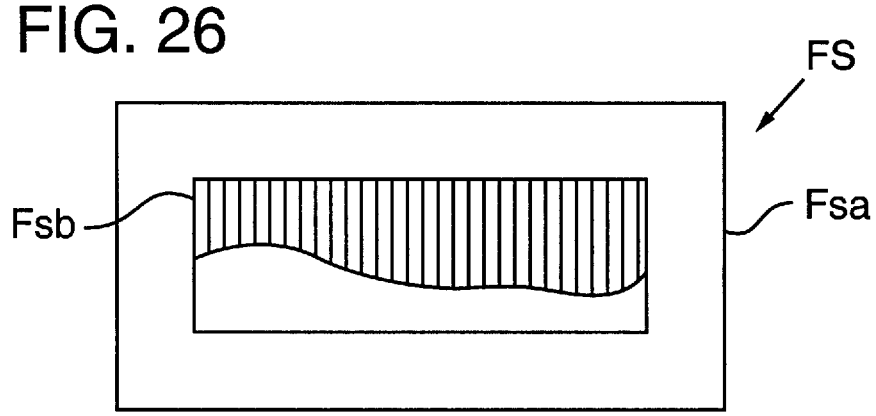
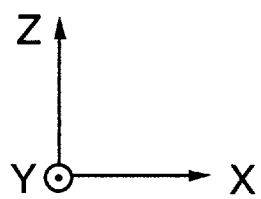

PROXIMITY-TYPE MICROLITHOGRAPHY APPARATUS AND METHOD

FIELD OF THE INVENTION

The invention pertains to proximity-type microlithography apparatus and methods useful for manufacturing semiconductor devices, liquid-crystal display elements, or the like. More particularly, the invention concerns proximity exposure apparatus and methods wherein a mask and a sensitized substrate are arranged in proximity relative to each other, the mask is illuminated with actinic light, and a pattern on the mask is printed onto the sensitized substrate preferably by scanning.

BACKGROUND OF THE INVENTION

Microlithography apparatus are conventionally used to transfer a desired pattern, defined by a mask or reticle, to a sensitized substrate (i.e., a substrate surface coated with a suitable photoresist or other photosensitive resin). The mask is typically formed by vapor deposition of a film of chromium or other suitable metal on a glass or analogous transparent material. The mask is irradiated with actinic light; light passing through the mask "prints" the mask pattern on the sensitive substrate.

Generally, microlithography apparatus and methods include (1) projection exposure, wherein the image on the mask is printed on the sensitive substrate using a projection optical system; (2) contact-exposure, wherein the mask and sensitized substrate directly contact each other during exposure of the sensitive substrate with the mask pattern; and (3) proximity-exposure, wherein the mask pattern is transferred to the sensitive substrate by irradiating the mask while the mask and the sensitized substrate are separated slightly from each other.

FIG. 1 shows a conventional proximity-exposure apparatus. Illuminant light is produced by a light source 1 and condensed by an elliptical mirror 2 to form a light-source image. Light from the light-source image is reflected by a planar mirror 3, converted into a substantially collimated beam by a collimating lens 4, and is incident upon a fly-eye lens 5. The fly-eye lens 5 splits the incident collimated light beam into a number of wavefronts, thereby forming multiple light-source images at the exit side of the fly-eye lens. Light from the multiple light-source images passes through, e.g., an aperture stop S defining a usually circular aperture. The light is condensed by a condenser optical system comprising a single concave mirror 6 having a front focal point at the location of the multiple light-source images. Light reflected from the concave mirror 6 illuminates a mask 7 placed superposedly relative to the sensitized substrate 8 (also termed herein a "workpiece"). The workpiece 8 is separated from the mask 7 by a prescribed small distance termed herein the "standoff." The illuminant light passing through transparent regions of the mask 7 are incident on the workpiece 8, thereby "transferring" the pattern defined by the mask 7 to the workpiece 8.

In conventional proximity-type microlithography apparatus as summarized above, the illuminance at the mask 7 and the obtainable resolution at the workpiece 8 are determined by the mask-side numerical aperture (NA) of the condenser optical system 4. More specifically, where B is the luminance of the light source 1, NA is the mask-side numerical aperture of the condenser optical system 4, and T is the transmittance of the optical system, the illuminance E at the mask is given by the following:

$$E = \pi \cdot B \cdot NA^2 \cdot T \tag{1}$$

In conventional proximity-type microlithography apparatus, the luminance B is fixed. The NA of the illumination striking the mask 7 is also constant and is not a function of the direction of propagation of the illumination light. The NA, however, is dictated by the resolution required for transferring the mask pattern to the sensitive substrate. Due to problems arising from diffraction, the NA must be small whenever a large resolving power is required. I.e., as the mask-side NA of the condenser optical system is increased, edge regions of pattern features of the mask 7 are transferred to the workpiece 8 with less definition, i.e., the resolution with which the mask pattern is transferred to the workpiece deteriorates (FIG. 2).

With conventional proximity microlithography apparatus, it has frequently not been possible to obtain a desired illuminance of the workpiece while also ensuring attainment of a required pattern-transfer resolution. The only way to increase the illuminance E at the mask 7 in order to improve throughput while maintaining resolution is to increase the luminance B of the light source 1. This requires a light source 1 having greater output intensity, which means greater size of and heat generation by the light source 1. This, in turn, results in unwanted increases in size and complexity of the lamp unit used as the light source.

SUMMARY OF THE INVENTION

The invention was conceived in light of the aforementioned problems. One object of the invention is to provide a scanning proximity-type microlithography apparatus operable to achieve a desired illuminance at the mask and sensitized substrate (workpiece) without any significant degradation of the resolution of the transferred pattern on the workpiece.

According to one aspect of the invention, a proximity-type microlithography apparatus is provided that comprises an illumination optical system for illuminating a planar mask defining a prescribed pattern and for forming an image of the mask pattern on the workpiece. The illumination optical system comprises a first illumination numerical aperture in a first direction in the plane of the mask pattern and a second illumination numerical aperture in a second direction, orthogonal to the first direction, in the plane of the mask pattern. The first numerical aperture is different from the second numerical aperture.

In a preferred embodiment, the mask pattern defines features having a long direction and a short direction. The first numerical aperture preferably extends in the long direction, leaving the second numerical aperture to extend in the short direction. In such an instance, the first numerical aperture is preferably larger than the second numerical aperture.

The illumination optical system preferably includes a light source operable to produce an illumination light flux. The illumination optical system also preferably includes a fly-eye lens or other "optical integrator" as known in the art (referred to generally herein as a "fly-eye lens"). The fly-eye lens is situated axially downstream of the light source and preferably comprises multiple lens elements so as to produce from the illumination light flux multiple light-source images arrayed in a plane transverse to the axis. The illumination optical system also preferably includes a stop situated axially downstream of the fly-eye lens. The stop defines an aperture (not necessarily round) through which light from the light-source images passes. Finally, the illumination optical system preferably includes a condenser lens situated axially downstream of the stop for condensing light passing through the aperture onto the mask. The aperture preferably has a transverse profile including a longer dimension and a shorter dimension orthogonal to the longer dimension. The longer dimension is aligned with the long dimension of the features defined by the mask, and the shorter dimension is aligned with the short dimension of the features defined by the mask.

The fly-eye lens preferably has an overall transverse profile having a long dimension and a short dimension orthogonal to the long dimension. Preferably, the long dimension of the fly-eye lens is preferably aligned with the long dimension of the features defined by the mask, and the short dimension is aligned with the short dimension of the features defined by the mask. Most preferably, the fly-eye lens has a rectangular transverse profile.

According to another aspect of the invention, a microlithography apparatus is provided that comprises an illumination optical system for illuminating a planar mask and for forming an image of the mask pattern on a photosensitive substrate (workpiece). The illumination optical system is situated along an optical axis and has a first workpiece-side numerical aperture $NA_1$ oriented in a first direction transverse to the optical axis. A second workpiece-side numerical aperture $NA_2$ is oriented in a second direction transverse to the optical axis and to $NA_1$. $NA_1$ is different than $NA_2$. Preferably, the following is satisfied:

$$0.01 < NA_2/NA_1 < 1.0.$$

Such an illumination optical system is preferably operable to form an illumination light flux having a prescribed transverse profile that is longer in the second direction than in the first direction. The mask and workpiece are preferably moved relative to each other to perform a scanning exposure of the workpiece with the mask pattern.

Such a microlithography apparatus also preferably includes an illumination light source operable to produce an illumination light flux. The apparatus also preferably includes a fly-eye lens (or other suitable "optical integrator") downstream of the illumination light source. Illumination light flux passing through the fly-eye lens is formed into multiple light-source images. The apparatus also preferably comprises a condenser optical system downstream of the fly-eye lens to condense light from the multiple light-source images. The condenser optical system has a first focal length $f_{con1}$ in the first direction and a second focal length $f_{con2}$ in the second direction ($f_{con1} \neq f_{con2}$). Further preferably, the apparatus comprises a collimating optical system situated between the illumination light source and the fly-eye lens. The collimating optical system is operable to form the illumination light flux into a substantially collimated light beam having a first focal length $f_{col1}$ in the first direction and a second focal length $f_{col2}$ in the second direction ($f_{col1} \neq f_{col2}$) Most preferably, $f_{col1} > f_{col2}$, and $f_{con1} < f_{con2}$.

According to another aspect of the invention, a proximity exposure method is provided in which a mask defining a prescribed pattern is illuminated by an illumination light flux to transfer the mask pattern to a sensitized surface of a workpiece. The workpiece is disposed, in proximity relationship to the mask, a standoff distance from the mask. The illumination light flux is provided having a first workpiece-side numerical aperture $NA_1$ in a scanning direction. The illumination light flux is also provided with a second workpiece-side numerical aperture $NA_2$ in a cross-scan direction, wherein $NA_1 > NA_2$. The mask is illuminated with the illumination light flux to transfer the mask pattern to the sensitized surface of the workpiece. Preferably, during such transfer, the mask and workpiece are moved relative to each other in the scanning direction.

Further with respect to the method, the mask preferably has features elongated in a first direction. The mask is thus illuminated while the first direction of the mask is aligned with the scanning direction. During such scanning exposure, the illumination light flux preferably has a transverse profile that is shorter in the first direction than in the second direction.

According to another aspect of the invention, a proximity-type microlithography apparatus is provided that comprises an illumination optical system for illuminating a planar mask defining a prescribed pattern and for forming an image of the mask pattern on a photosensitive substrate. The illumination optical system comprises a relay optical system comprising first and second spherical mirrors. The mirrors are situated so as to condense meridional rays, in a light flux propagating from an object point, at a point conjugate to the object point. The mirrors also substantially collimate sagittal rays in the light flux propagating from the object point. The second spherical mirror is situated so as to condense at a single image point the meridional rays propagating from the conjugate point and the substantially collimated sagittal rays.

According to another aspect of the invention, a proximity-type microlithography apparatus is provided for illuminating a mask defining a prescribed pattern and to transfer the pattern from the mask to a workpiece separated from the mask by a prescribed standoff. The apparatus comprises an illumination optical system for directing an illumination light flux along a first axis to illuminate an area on a plane conjugate to the mask and transverse to the first axis. The apparatus also comprises a relay optical system for re-imaging on the mask the region illuminated by the illumination optical system. The relay optical system comprises a first spherical mirror having a center of curvature and a radius of curvature R1. The relay optical system also comprises a second spherical mirror having a center of curvature and a radius of curvature R2. The first and second centers of curvature are situated on a straight second axis (preferably parallel to the first axis). The illuminated region is preferably situated in a plane transverse to the second axis and including the first center of curvature. The first and second centers of curvature are separated from each other on the second axis by a distance L that preferably equals $|R1-R2|/2^{1/2}$. Further preferably, the distance between the first and second centers of curvature on the second axis is a distance L according to the following:

$$0.8L < |R1-R2|/2^{1/2} < 1.2L$$

The signs of the radii of curvature R1 and R2 are positive when the corresponding mirror surfaces are convex when viewed from the first center of curvature. Also, rays within the plane containing the object point and the second axis are meridional rays, and rays in directions perpendicular to the meridional rays are sagittal rays.

According to yet another aspect of the invention, a reflection optical system is provided, comprising first and second spherical mirrors. The first spherical mirror is positioned so as to condense meridional rays, in a light flux propagating from an object point, at a point that is conjugate to the object point, and to substantially collimate sagittal rays in the light flux propagating from the object point. The second spherical mirror is positioned so as to condense the meridional rays propagating from the conjugate point and the substantially collimated sagittal rays at an image point.

The foregoing and additional features and advantages of the present invention will be more readily apparent from the following detailed description, which proceeds with reference to the accompanying drawings.

BRIEF DESCRIPTION OF THE DRAWINGS

FIGS. 4(a)–4(b) schematically show the configuration of an apparatus according to Example Embodiment 1, wherein FIG. 4(a) shows the YZ plane and FIG. 4(b) shows the XY plane.

FIGS. 6(a)–6(b) schematically show the configuration of an apparatus according to Example Embodiment 3, wherein FIG. 6(a) shows the YZ plane and FIG. 6(b) shows the XY plane.

FIGS. 9(a)–9(b) schematically show the configuration of an apparatus according to Example Embodiment 5, wherein FIG. 9(a) shows the YZ plane and FIG. 9(b) shows the XY plane.

FIGS. 10(a)–10(b) show transverse profiles of first and second fly-eye lenses, respectively, as used in Example Embodiment 5, wherein FIG. 10(a) shows the XZ plane of the first fly-eye lens and FIG. 10(b) shows the XZ plane of the second fly-eye lens.

FIGS. 11(a)–11(b) schematically show the configuration of an apparatus according to Example Embodiment 6, wherein FIG. 11(a) shows the YZ plane and FIG. 11(b) shows the XY plane.

FIG. 16 shows, with respect to Example Embodiment 8, the transverse profile of the aperture defined by the aperture stop relative to the overall transverse profile of the fly-eye lens.

FIG. 17 shows, with respect to Example Embodiment 9, the transverse profile of the aperture defined by the aperture stop relative to the overall transverse profile of the fly-eye lens.

FIG. 18 schematically shows the configuration of an apparatus according to Example Embodiment 10.

FIG. 19 schematically shows the configuration of an apparatus according to Example Embodiment 11.

FIGS. 20(a)–20(c) schematically show the configuration of an apparatus according to Example Embodiment 12.

FIG. 21 schematically shows the configuration, within the meridional plane, of the apparatus of Example Embodiment 12.

FIG. 26 shows a transverse profile of an adjustable field stop as used in Example Embodiment 13.

DETAILED DESCRIPTION

Generally, when a mask defines pattern features having directionality, if the cross-sections of features extending in the short direction of the pattern formed on the photosensitive substrate are formed with sufficient sharpness, then the cross-sections of features extending in the long direction of the pattern can be formed with a lesser degree of sharpness. In other words, to achieve the required pattern-transfer resolution, the illumination numerical aperture in the short direction of the pattern is made sufficiently small for good resolution, but the illumination numerical aperture in the long direction of the pattern can be set to a somewhat larger value without significantly degrading resolution.

Microlithography apparatus according to this invention are configured such that the illumination optical system thereof has substantially different illumination numerical apertures in two mutually orthogonal directions in the plane of the mask pattern. That is, a first illumination numerical aperture $NA_1$, extending in the long direction of the mask pattern, is preferably substantially larger than a second illumination numerical aperture $NA_2$ that extends in the short direction of the mask pattern.

To such end, for example, the illumination optical system can produce an illumination light flux having an elliptical transverse profile; in such an instance, the illuminance E at the mask is given by the expression:

$$E = \pi \cdot B \cdot NA_1 \cdot NA_2 \quad (1)$$

The second illumination numerical aperture $NA_2$ is set sufficiently small in order to ensure the required pattern resolution on the workpiece. The first illumination numerical aperture $NA_1$ can be set larger than $NA_2$ without substantially impairing the pattern precision. By setting $NA_2$ sufficiently small and setting $NA_1$ sufficiently large, it is possible to obtain a desired high illuminance at the photosensitive surface of the workpiece without significantly compromising the resolution of the transferred pattern.

Figure 3:
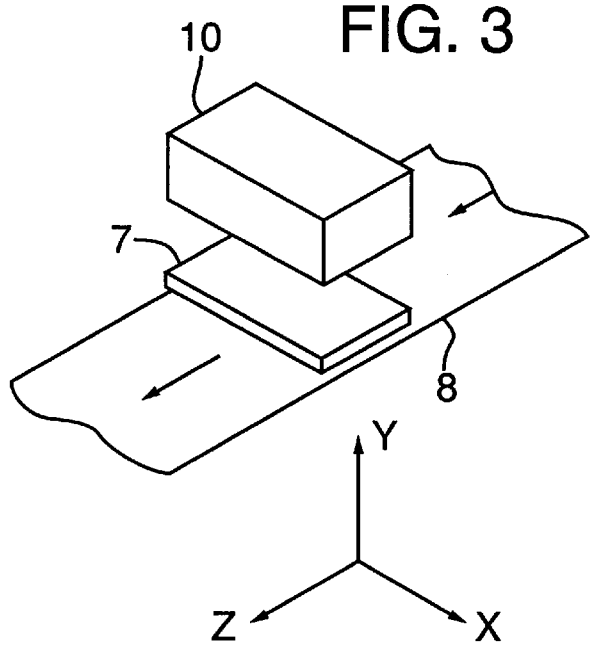
FIG. 3 is an oblique elevational depiction of the overall configuration of a scanning proximity-type microlithography apparatus according to the invention.

FIG. 3 depicts certain aspects of a scanning proximity-type microlithography apparatus according to this invention. Conventional XYZ coordinates are used. The apparatus comprises an illumination optical system 10 that irradiates a mask 7 with illuminant light. The mask 7 defines a pattern having features that are preferably elongated in the Z direction. The substrate (termed generally herein a "workpiece") 8 comprises a surface film that has been coated with a "photoresist" or other photosensitive resin. The workpiece 8 is conveyed at a prescribed velocity in the Z direction. Thus, the Z-elongated pattern defined by the mask 7 is transferred to the photosensitive resin on the workpiece 8.

Example Embodiment 1

Figure 4A:
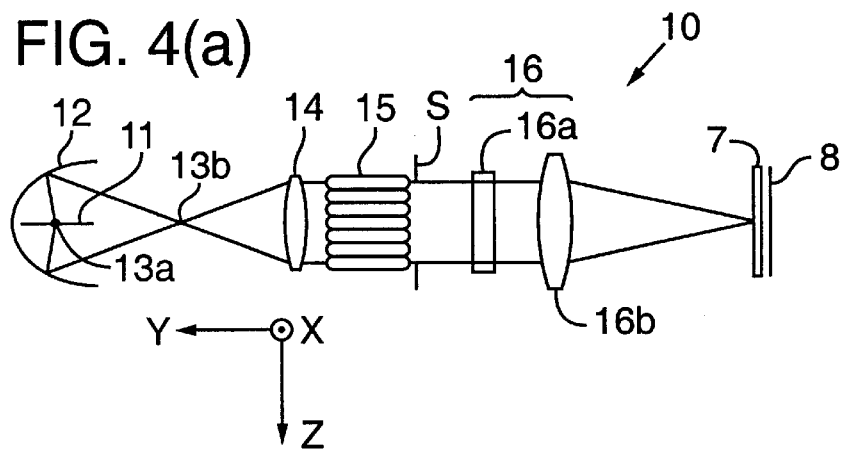
Figure 4B:
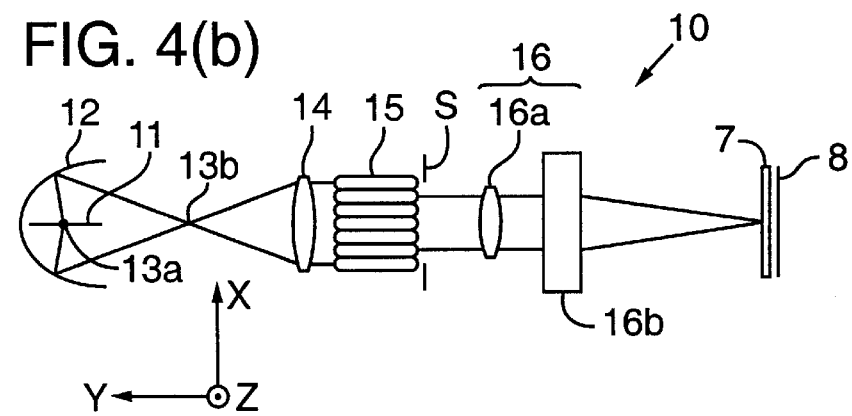

This example embodiment comprises features shown generally in FIG. 3. In addition, FIGS. 4(a)–4(b) depict certain aspects of the illumination optical system 10 used in this embodiment. FIG. 4(a) illustrates the YZ plane, and FIG. 4(b) illustrates the XY plane. Light is produced by a light source 11 comprising, for example, a high-pressure mercury vapor lamp. The light is condensed by an elliptical mirror 12 having a first focus point 13a and a second focus point 13b. The light source 11 is situated at the first focus point 13a, and an image of the light source 11 is formed at the second focus point 13b. Light from the light-source image is collimated by a collimating lens 14 and is incident upon a fly-eye lens 15. The collimating lens 14 is arranged such that its front focal point is located at the position of the light-source image produced by the elliptical mirror 12. As a result, a substantially collimated light beam is introduced to the fly-eye lens 15. The fly-eye lens 15 preferably comprises a stacked matrix of multiple parallel lens elements each having a quadrilateral or hexagonal transverse profile. Each of the lens elements of the fly-eye lens 15 condenses a respective portion of the collimated light beam from the collimating lens 14. The fly-eye lens 15 forms multiple light-source images at the exit-plane side of the fly-eye lens 15. A stop S defining a substantially circular aperture is situated where the multiple light-source images are formed, and light passing through the aperture is directed toward a condenser optical system 16 comprising a first cylindrical lens 16a and a second cylindrical lens 16b. Each of the cylindrical lenses 16a, 16b has a different focal length.

The first cylindrical lens 16a has a focal length $f_{con2}$ in the XY plane only, and the second cylindrical lens 16b has focal length $f_{con1}$ in the YZ plane only. Each of the cylindrical lenses 16a and 16b is arranged such that its respective front focal point substantially coincides with the multiple light-source images produced by the fly-eye lens 15. Light passing through the condenser optical system 16 telecentrically illuminates the mask 7.

In this example embodiment the focal lengths $f_{con2}$ and $f_{con1}$ satisfy the following relationship:

$$f_{con1} < f_{con2} \qquad (2)$$

Accordingly, the numerical aperture of the condenser optical system 16 at the mask 8 is larger in the Z direction than in the X direction.

The ratio β of the numerical apertures of the condenser optical system 16 is determined as follows:

$$\beta = NA_1/NA_2 = f_{con2}/f_{con1} \qquad (3)$$

In FIGS. 4(a)–4(b), the workpiece 8 is arranged behind (i.e., in the -Y direction from) and separated from the mask 7 by a prescribed standoff. As described above, the workpiece 8 is supported in a manner to allow movement in the Z direction, thereby achieving scanned exposure of the workpiece 8.

As stated above, the mask 7 defines a pattern having features elongated in the Z direction. During transfer of the pattern, the workpiece 8 is moved in the Z direction (FIG. 3). In such a situation, there is no problem with low resolution in the Z direction.

In the following, B denotes the luminance of the light source 11, $NA_1$ denotes the mask-side numerical aperture of the condenser optical system 16 in the Z direction, $NA_2$ denotes the mask-side numerical aperture of the condenser optical system in the X direction, and T denotes the transmittance of the condenser optical system 16. The illuminance E at the workpiece 8 is expressed as:

$$E = \pi \cdot B \cdot NA_1 \cdot NA_2 \cdot T \qquad (4)$$

From expression (2), above, the following is noted:

$$NA_1 > NA_2 \qquad (5)$$

$NA_2$, defined by the resolution of the mask-pattern pitch direction, is about the same as in a conventional proximity-type microlithography apparatus. As a result, the illuminance E at the workpiece 8 is increased in this example embodiment by the factor β compared with such conventional apparatus.

The components and configuration of the illumination optical system 10 from the light source 11 to the fly-eye lens 15 can be substantially similar to such systems found in conventional proximity-type microlithography apparatus. Thus, this example embodiment is manufacturable by known methods.

In illuminating a mask pattern that is elongated in a prescribed direction, since $NA_1$ is larger than $NA_2$ illuminance at the workpiece 8 can be increased and throughput can be improved with no accompanying reduction in resolution when the pattern is transferred.

In this example embodiment, a toric lens possessing different focal lengths in perpendicular directions can be used instead of the pair of cylindrical lenses 16a and 16b. Also, the stop S is not limited to having a circular aperture; the aperture can have any of various other suitable profiles.

Example Embodiment 2

Figure 5:
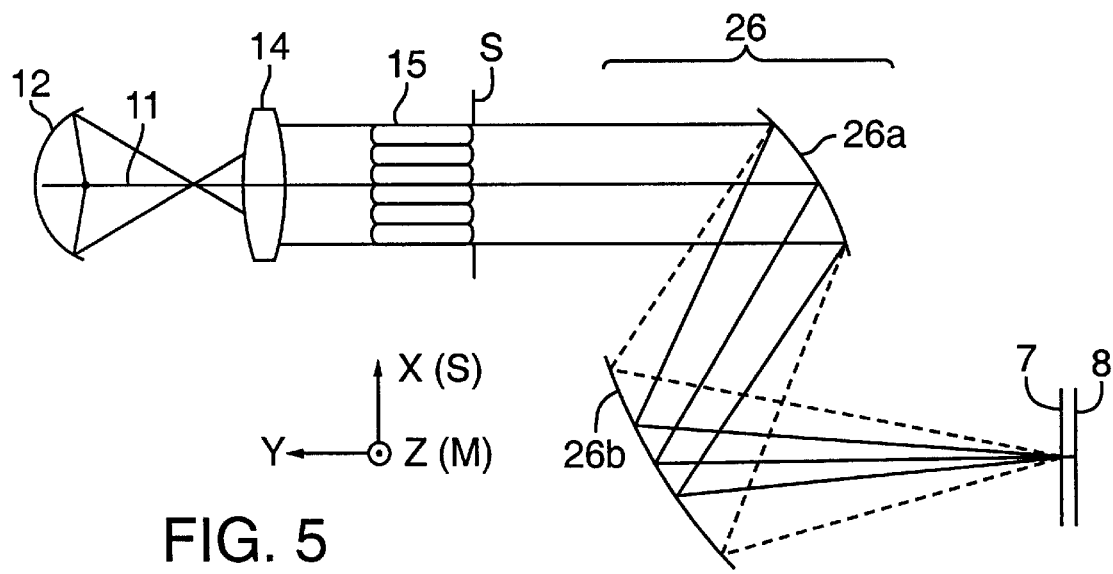
FIG. 5 schematically shows the configuration of an apparatus according to Example Embodiment 2.

This example embodiment is depicted in FIG. 5, in which the cylindrical lenses 16a and 16b of the condenser optical system 16 in example embodiment 1 have been replaced with cylindrical mirrors 26a and 26b. In FIG. 5, components that are the same as in example embodiment 1 are denoted using the same reference designators. Also, at the mask 7 and workpiece 8, FIG. 5 utilizes the same coordinate system as used in FIGS. 4(a)–4(b). In the optical path from the light source 11 to the mask 7, the light beam in the XY direction at the mask 7 has a cross-section indicated by a solid line, and the light beam in the YZ plane at the mask 7 has a cross-section indicated by a broken line. In the descriptions below, the direction ("second direction") corresponding to the X direction at the mask 7 is denoted as the "S" direction, and the direction ("first direction") corresponding to the Z direction at the mask 7 is denoted as the "M" direction.

Referring further to FIG. 5, light from the light source 11, as in the case of example embodiment 1, reflects from the elliptical mirror 12 and passes sequentially through the collimating lens 14 and the fly-eye lens 15. The fly-eye lens 15 forms multiple light-source images at the plane of an aperture defined by the stop S (the stop S is situated at the exit-plane side of the fly-eye lens 15). Light from the multiple light-source images is condensed by a condenser optical system 26 comprising a pair of cylindrical mirrors 26a, 26b. The mask 7 is illuminated by superimposed light fluxes (solid and broken lines, wherein the optical path in the M direction is indicated by a broken line, and the optical path in the S direction is indicated by a solid line).

The first cylindrical mirror 26a has a focal length $f_{con2}$ in the S direction in the optical path, and the second cylindrical mirror 26b has a focal length $f_{con1}$ in the M direction in the optical path. The first cylindrical mirror 26a has no light-bending power in the M direction, and the second cylindrical mirror 26b has no light-bending power in the S direction.

Light from the multiple light-source images formed by the fly-eye lens 15 is condensed by the first cylindrical mirror 26a (having power only in the S direction). The light is then reflected by the second cylindrical mirror 26b (having no power in the S direction) and is incident on the mask 7. The mask 7 is thus illuminated by a light flux having a numerical aperture $NA_2$. Also, light from the multiple light-source images produced by the fly-eye lens 15 is deflected by the first cylindrical mirror 26a (having no power in the M direction) and is condensed by the second cylindrical mirror 26b (having power only in the M direction), and is incident on the mask 7. Thus, the mask 7 is illuminated by a light flux having a numerical aperture $NA_1$.

The numerical aperture $NA_2$ is determined by the focal length $f_{con2}$ of the second cylindrical mirror 26a, and the numerical aperture $NA_1$ is determined by the focal length $f_{con1}$ of the first cylindrical mirror 26b. These numerical apertures $NA_1$ and $NA_2$ and the focal lengths $f_{con1}$ and $f_{con2}$, respectively, satisfy expressions (2) through (5) above.

Example embodiment 2 shares the benefits of example embodiment 1. In addition, by employing as a condenser optical system two mirrors having different focal lengths in two perpendicular directions, example embodiment 2 advantageously allows the mask 7 to be illuminated using a wide range of wavelengths while still providing satisfactory optical performance and with no significant adverse effects caused by chromatic aberration.

Example Embodiment 3

Figure 6A:
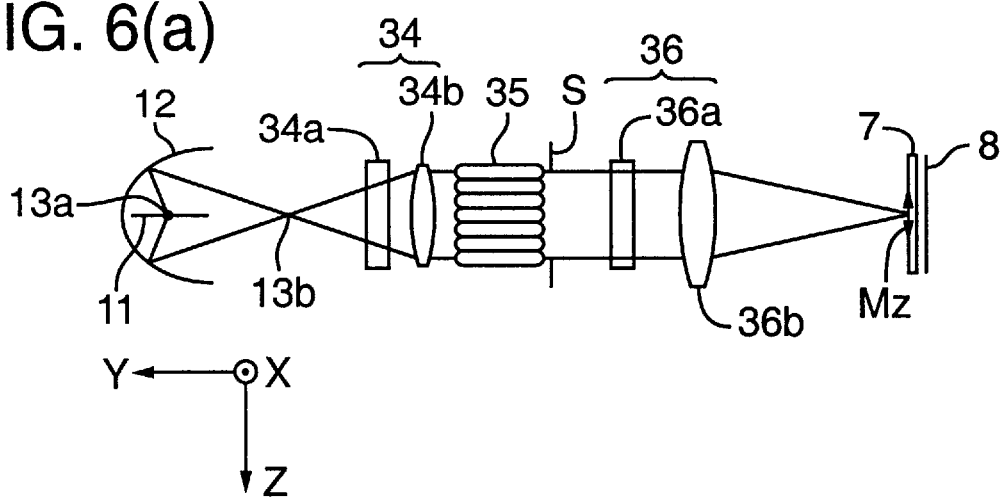
Figure 6B:
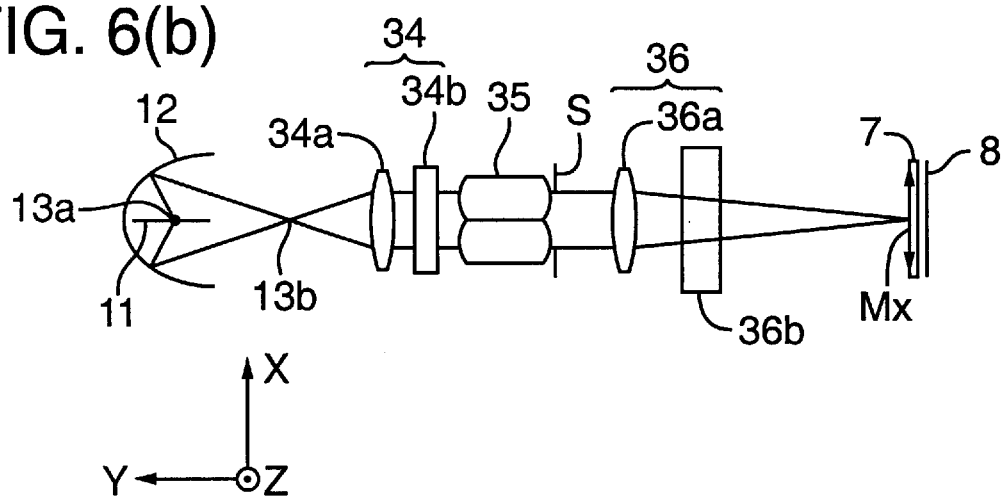

Example embodiment 3 is described with reference to FIGS. 6(a)–6(b). FIG. 6(a) is a view of the YZ plane, and FIG. 6(b) is a view of the XY plane. In FIGS. 6(a)–6(b), components that are the same as in example embodiments 1 and 2 have the same reference designators. Also, the coordinate system used in FIGS. 6(a)–6(b) is the same as used in example embodiments 1 and 2.

This example embodiment comprises a collimating optical system 34, which supplies a substantially collimated light beam to an optical integrator (fly-eye lens 35). The collimating optical system 34 has different focal lengths in respective perpendicular directions. This example embodiment also comprises a condenser optical system 36 that condenses light from the optical integrator 35 to illuminate the mask 7. The condenser optical system 36 also has different focal lengths in respective perpendicular directions.

Referring further to FIGS. 6(a)–6(b), light from the light source 11 is condensed by the elliptical mirror 12 arranged such that the light source 11 is situated at the first focal point 13a of the elliptical mirror 12, and an image of the light source forms at the second focal point 13b of the mirror 12. Light from the light-source image passes through the collimating optical system 34 comprising a first condenser lens 34a (having refractive power within the XY plane only) and a second condenser lens 34b (having refractive power within the YZ plane only). The light is incident on the fly-eye lens 35. The condenser lenses 34a, 34b are mounted such that their respective front focal points are located at the position of the light-source image produced by the elliptical mirror 12. The light flux incident upon the fly-eye lens 35 is substantially collimated light and has an essentially elliptical transverse profile (in the XZ plane).

Figure 7:
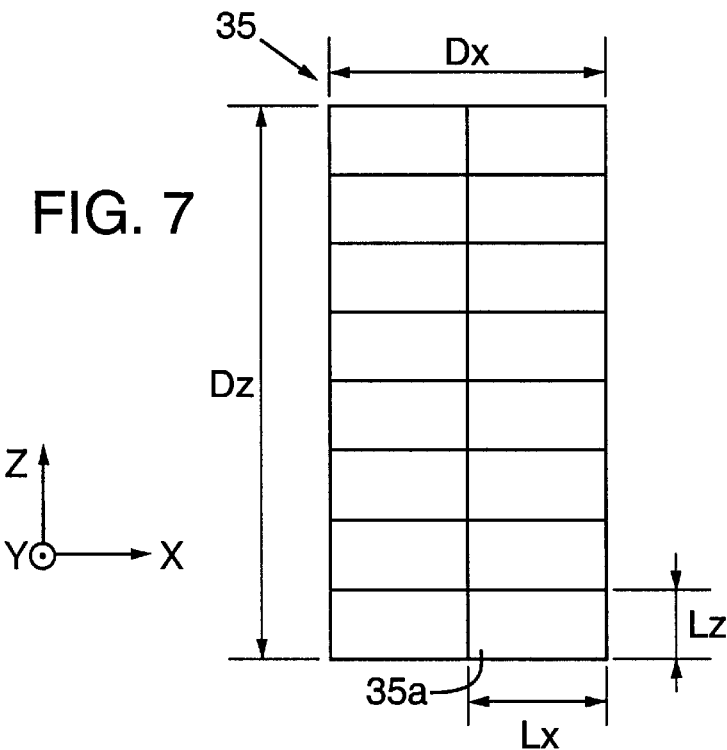
FIG. 7 shows, in the XZ plane, the transverse profile of the fly-eye lens used in Example Embodiment 3.

The fly-eye lens 35, as shown in FIG. 7, comprises a cluster of multiple lens elements 35a, the transverse sectional profile of each being rectangular. Each rectangle has a dimension $L_x$ in the X direction and a dimension $L_z$ in the Z direction ($L_x \neq L_z$). The rectangular transverse profile of the entire cluster has a dimension $D_x$ in the X direction and a dimension $D_z$ in the Z direction ($D_x \neq D_z$).

Referring further to FIGS. 6(a) and 6(b), the stop S defines a substantially elliptical aperture and is arranged at the exit side of the fly-eye lens 35. The multiple light-source images formed by the respective lens elements of the fly-eye lens 35 are located at the opening of the stop S.

Light from the multiple light-source images is incident upon the condenser optical system 36. The condenser optical system 36 comprises a first condenser lens 36a (having refractive power within the XY plane only) and a second condenser lens 36b (having refractive power within the YZ plane only). The condenser lenses 36a, 36b are mounted such that their respective front focal points are located on the plane defined by the multiple light-source images produced by the fly-eye lens 35. Accordingly, the mask 7 is illuminated telecentrically by the light from the multiple light-source images.

As in example embodiments 1 and 2, example embodiment 3 is constituted such that the mask-side numerical aperture $NA_1$ of the condenser optical system 36 in the YZ plane and the mask-side numerical aperture $NA_2$ of the condenser optical system in the XY plane satisfy the following expression:

$$NA_1 > NA_2 \tag{5}$$

The condenser optical system 36 forms a rectangular illumination region of length $M_x$ in the X direction and length $M_z$ in the Z direction on the mask 7.

In the following, the focal length of the second collimating lens 34b in the YZ plane is denoted $f_{col1}$, the focal length of the first collimating lens 34a in the XY plane is denoted $f_{col2}$, the X-direction dimension of each element 35a making up the fly-eye lens 35 is denoted $L_x$, the Z-direction dimension of each element 35a is denoted $L_z$, the overall dimension in the X direction of the fly-eye lens 35 is denoted $D_x$, the overall dimension in the Z direction of the fly-eye lens 35 is denoted $D_z$, the focal length in the XY plane of the first condenser lens 36a is denoted $f_{con2}$, and the focal length in the YZ plane of the second condenser lens 36b is denoted $f_{con1}$.

With respect to the condenser optical system 36, the ratio β of the mask-side numerical aperture $NA_1$ (in the YZ plane) to the mask-side numerical aperture $NA_2$ (in the XY plane) is:

$$\beta = NA_1/NA_2 \tag{6}$$

The ratio k of the focal lengths of the first and second collimating lenses 34a, 34b is:

$$k = f_{col2}/f_{col1} \tag{7}$$

The ratio m of the focal lengths of the first and second condenser lenses 36a, 36b is:

$$m = f_{con2}/f_{con1} \tag{8}$$

In view of expressions (7) and (8) being satisfied, the numerical-aperture ratio β satisfies the following relationship:

$$\beta = m/k \tag{9}$$

If $k \geq 1$ then $m \leq 1$, and if $k \leq 1$ then $m \geq 1$.

The dimension $L_x$ in the X direction and the dimension $D_z$ in the Z direction of each lens element 35a of the fly-eye lens 35 satisfy the following:

$$(L_z/L_x)/m = M_z/M_x \qquad (10)$$

The overall dimension $D_x$ in the X direction and dimension $D_z$ in the Z direction of the fly-eye lens 35 have the same ratio as the corresponding X- and Y-direction dimensions of the aperture defined by the stop S. Thus, the following relationship is satisfied:

$$(D_z/D_x)m = NA_2/NA_1 \qquad (11)$$

The collimating optical system 34 and the condenser optical system 36 are constituted such that k<1 and m>1. Thus, the following expressions are satisfied:

$$f_{col1} > f_{col2} \qquad (12)$$

$$f_{con1} < f_{con2} \qquad (13)$$

The illuminance E at the workpiece 8 satisfies the following expression, as does example embodiment 2:

$$E = \pi \cdot B \cdot NA_1 \cdot NA_2 \cdot T \qquad (4)$$

Since the numerical aperture $NA_2$, defined by the resolution in the pitch direction of the pattern, is about the same as with a conventional apparatus, the illuminance E at the workpiece 8 is increased by the factor β over that achieved using a conventional apparatus.

Because the burden of making the numerical aperture different in perpendicular directions is shared by the collimating optical system 34 and the condenser optical system 36, this embodiment advantageously provides improved optical performance at a lower risk of unreasonable demands being placed on the design of these optical systems.

In addition, although this example embodiment utilizes a fly-eye lens 35 comprising a 2×8 cluster of lens elements 35a, the fly-eye lens can have any of various other configurations.

Example Embodiment 4

Figure 8:
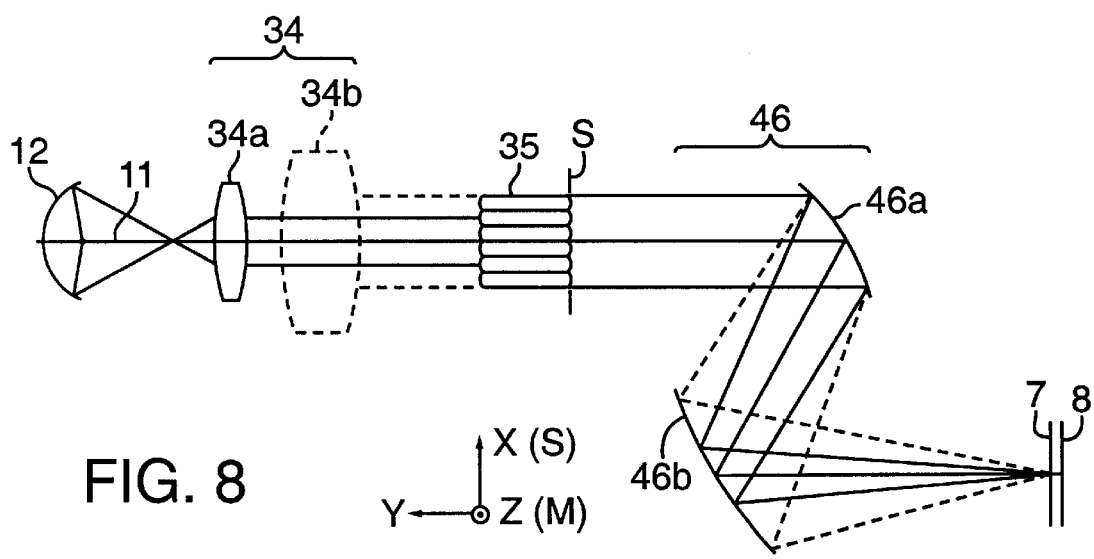
FIG. 8 schematically shows the configuration of an apparatus according to Example Embodiment 4.

Example embodiment 4 is shown in FIG. 8. In this example embodiment, first and second cylindrical mirrors 46a, 46b constitute a condenser optical system 46 that replaces the first and second cylindrical lenses 36a, 36b utilized in example embodiment 3.

Components in FIG. 8 that are the same as in FIGS. 6(a)–6(b) and 7 have the same reference designators. Also, FIG. 8 employs a coordinate system similar to that of FIG. 6(b) at the mask 7 and workpiece 8; in the optical path from the light source 11 to the mask 7, the cross-section of the light beam in the XY direction at the mask 7 is indicated by a solid line, and the cross-section of the light beam in the YZ direction at the mask 7 is indicated by a broken line. In the following discussion, the direction corresponding to the X direction at the mask 7 is regarded as the "S" direction, and the direction corresponding to the Z direction at the mask 7 is regarded as the "M" direction.

Referring further to FIG. 8, light from the light source 11 reflects from the elliptical mirror 12 and passes sequentially through the collimating optical system 34 and the fly-eye lens 35. The fly-eye lens 35 forms multiple light-source images at the aperture defined by the stop S, the light-source images being arranged as a plane at the exit-plane side of the fly-eye lens 35. Light from the multiple light-source images is condensed by the condenser optical system 46 (comprising first and second cylindrical mirrors 46a, 46b). Light from the light-source images superimposedly illuminates the mask 7.

The second collimating lens 34b has a focal length $f_{col1}$ in the M direction in the optical path, and the first collimating lens 34a has a focal length $f_{con2}$ in the S direction in the optical path. The first cylindrical mirror 46a has a focal length $f_{con2}$ in the S direction in the optical path, and the second cylindrical mirror 46b has a focal length $f_{con1}$ in the M direction in the optical path. The first collimating lens 34a has no refractive power in the M direction, and the second collimating lens 34b has no refractive power in the S direction. The first cylindrical mirror 46a has no power in the M direction, and the second cylindrical mirror 46b has no power in the S direction.

In the S direction, light from the light-source image formed by the elliptical mirror 12 is collimated by the first collimating lens 34a (having refractive power in the S direction only). The light then passes through the second collimating lens 34b (having no refractive power in the S direction) and is incident upon the fly-eye lens 35. The fly-eye lens 35 forms multiple light-source images. Light from the multiple light-source images is condensed by the first cylindrical mirror 46a (having power in the S direction only). The light is then deflected by the second cylindrical mirror 46b (having no power in the S direction) and arrives at the mask 7. The mask 7 is illuminated by a light flux having a numerical aperture $NA_2$.

With respect to the optical path in the M direction, light from the light-source image formed by the elliptical mirror 12 passes through the first collimating lens 34a (having no refractive power in the M direction) and is collimated by the second collimating lens 34b (having refractive power in the M direction only). The light is then incident upon the fly-eye lens 35. The fly-eye lens 35 forms multiple light-source images. Light from the multiple light-source images is deflected by the first cylindrical mirror 46a (having no power in the M direction) and condensed by the second cylindrical mirror 46b (having power in the M direction only), and arrives at the mask 7. The mask 7 is illuminated by a light flux having a numerical aperture $NA_1$.

The numerical aperture $NA_1$ is determined by the diameter in the M direction of the aperture defined by the stop S and by the focal length $f_{con1}$ of the second cylindrical mirror 46b. The numerical aperture $NA_2$ is determined by the diameter in the S direction of the aperture defined by the stop S and by the focal length $f_{con2}$ of the first cylindrical mirror 46a. The numerical apertures $NA_1$ and $NA_2$, the profile of the stop aperture, and the focal lengths $f_{con1}$ and $f_{con2}$ satisfy expression (3), above.

By thus employing a condenser optical system having different focal lengths in two perpendicular directions, this example embodiment advantageously provides illumination of the mask 7 at a wide range of wavelengths while providing satisfactory optical performance. This example embodiment also exhibits no adverse effects caused by chromatic aberration in the illumination optical system, and exhibit the benefits noted above with respect to example embodiment 3.

Example Embodiment 5

Example embodiment 5 is discussed with reference to FIGS. 9(a)–9(b). FIG. 9(a) is a view of the YZ plane, and FIG. 9(b) is a view of the XY plane. In FIGS. 9(a)–9(b), components that are the same as in the foregoing example embodiments have the same reference designators. Also, the XYZ coordinate system used in FIGS. 9(a)–9(b) is similar to that used in FIG. 3 and FIGS. 4(a)–4(b).

This example embodiment comprises a secondary light source that produces multiple light-source images formed by a first fly-eye lens and a tertiary light source that produces multiple light-source images formed by a second fly-eye lens. The overall transverse profile of the second fly-eye lens is rectangular.

Light from the primary light source 11 is condensed by the elliptical mirror 12 arranged such that its first focal point 13a is located at the light source 11, and an image of the primary light source 11 is formed at the second focal point 13b of the elliptical mirror 12. Light from the image of the primary light source is collimated by the collimating optical system 14, and is incident upon a first fly-eye lens 55 as a substantially collimated light beam.

Figure 10A:
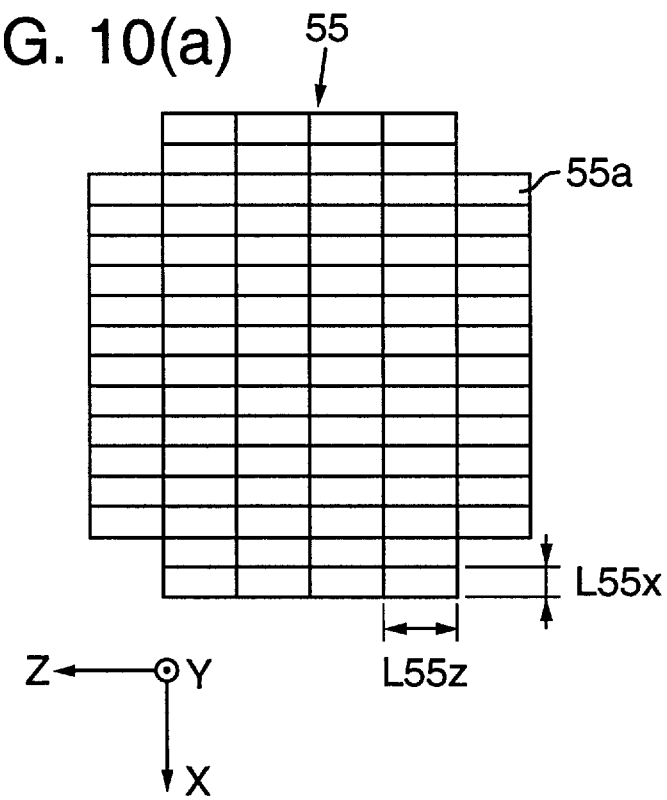

The first fly-eye lens 55, having a transverse profile as shown in FIG. 10(a), comprises a cluster of lens elements 55a. The transverse section of each lens element 55a has a dimension $L_{55x}$ in the X direction and a dimension $L_{55z}$ in the Z direction. The lens elements 55a collectively form multiple light-source images on a transverse plane at the exit-plane side of the first fly-eye lens 55.

A first stop S1 defining a substantially circular aperture is provided at the plane of the multiple light-source images produced by the first fly-eye lens 55. After passing through the aperture of the first stop, the light is condensed by a relay lens 57 (having a front focal point located at the plane of the multiple light-source images produced by the first fly-eye lens 55) so as to be incident on a second fly-eye lens 58. The entrance plane of the second fly-eye lens 58 is located where the multiple light-source images respectively formed by the plurality of lens elements 55a are converged so as to be superimposed on each other.

Figure 10B:
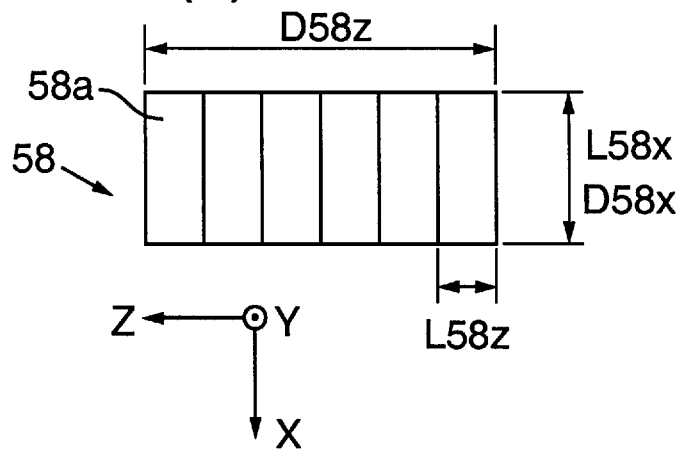

The second fly-eye lens 58, as shown in FIG. 10(b), comprises a cluster of lens elements 58a. The transverse section of each lens element 58a has a dimension $L_{58x}$ in the X direction and a dimension $L_{58z}$ in the Z direction. The transverse profile of the entire cluster has a dimension $D_{58x}$ in the X direction and a dimension $D_{58z}$ in the Z direction.

Referring further to FIGS. 9(a)–9(b), multiple light-source images are formed at the exit-plane side of the second fly-eye lens 58. A second stop S2 defining a substantially elliptical aperture is situated where the multiple light-source images produced by the second fly-eye lens 58 are formed. The ratio of the major and minor axes of the elliptical aperture defined by the second stop S2 is substantially equal to the ratio of the dimension $D_{58x}$ to the dimension $D_{58z}$.

Light from the multiple light-source images produced by the second fly-eye lens 58 is condensed by a condenser lens 56. The condenser lens 56 has a front focal point at the location of the multiple light-source images produced by the second fly-eye lens 58, and illuminates the mask 7 telecentrically with light from the multiple light-source images superimposed on one another.

The ratio of the length $M_x$ in the X direction and the length $M_z$ in the Z direction of the illumination region formed on the mask 7 is equal to the ratio of the dimension $L_{58x}$ in the X direction to the dimension $L_{58z}$ in the Z direction of the elements 58a making up the second fly-eye lens 58. I.e., the following relationship exists:

$$M_x/M_z = L_{58x}/L_{58z} \tag{14}$$

If the ratio of the major and minor axes of the aperture defined by the second stop S2 is substantially equal to the ratio of the dimensions $D_{58x}$ and $D_{58z}$, then the ratio of the numerical aperture $NA_1$ in the YZ plane and the numerical aperture $NA_2$ in the XY plane is as follows:

$$NA_2/NA_1 = D_{58x}/D_{58z} \tag{15}$$

In order to efficiently introduce light to the second fly-eye lens 58 (having a rectangular transverse profile) this example embodiment is configured such that the transverse profile of each of the elements 55a making up the first fly-eye lens 55 approximates the overall transverse profile of the second fly-eye lens 58. Thus, in this example embodiment, the following relationship is satisfied with respect to the dimension $L_{55x}$ in the X direction and the dimension $L_{55z}$ in the Z direction of the elements 55a, and with respect to the overall dimension $D_{58x}$ in the X direction and the overall dimension $D_{58z}$ in the Z direction of the second fly-eye lens 58:

$$L_{55x}/L_{55z} = D_{58x}/D_{58z} \tag{16}$$

Example embodiment 5 also satisfies the relationship:

$$NA_1 > NA_2 \tag{5}$$

Accordingly, whenever the ratio of the major and minor axes of the aperture defined by the second stop S2 is substantially equal to the ratio of the dimensions $D_{58x}$ and $D_{58z}$, then the following relationship is satisfied:

$$D_{58x} < D_{58z} \tag{17}$$

The illuminance E at the workpiece 8 satisfies the following relationship:

$$E = \pi \cdot B \cdot NA_1 \cdot NA_2 \cdot T \tag{4}$$

Since the numerical aperture $NA_2$, defined by the resolution in the pattern pitch direction, is about the same as in a conventional apparatus, the illuminance E at the workpiece 8 is increased with this example embodiment by the factor β compared to the illuminance obtained with a conventional apparatus.

Because the optical system (except for the first and second fly-eye lenses 55, 58) in this example embodiment can be constructed using ordinary rotationally symmetrical optical components, its manufacture and adjustment are advantageously facilitated. This example embodiment also has the benefits discussed above with respect to the example embodiments shown in FIG. 3 and in FIGS. 4(a)–4(b).

Example Embodiment 6

Example embodiment 6 is described with reference to FIGS. 11(a)–11(b). FIG. 11(a) is a view of the YZ plane, and FIG. 11(b) is a view of the XY plane. In FIGS. 11(a)–11(b), components that are the same as in the foregoing example embodiments have the same reference designators. FIGS. 11(a)–11(b) employ an XYZ coordinate system similar to that used in FIG. 3 and FIGS. 4(a)–4(b).

This example embodiment also employs an optical system in which the relay lens of example embodiment 5 is made with different focal lengths in mutually perpendicular directions.

Figure 12:
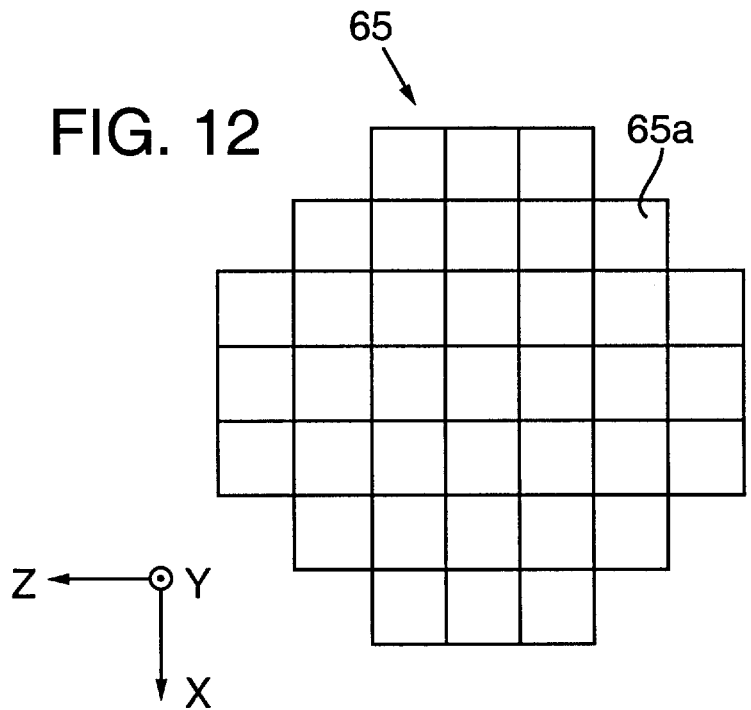
FIG. 12 shows, in the XZ plane, the transverse profile of the fly-eye lens used in Example Embodiment 6.

Referring to FIGS. 11(a)–11(b), light from a light source 11 is condensed by an elliptical mirror 12 that is arranged such that its first focal point 13a is located at the light source 11, and an image of the light source 11 is formed at the second focal point 13b of the mirror 12. Light from the light-source image is collimated by a collimating lens 14 and is incident upon a first fly-eye lens 65 as a substantially collimated light beam. The first fly-eye lens 65, as shown in FIG. 12, comprises a cluster of lens elements 65a that are essentially square in transverse profile. The first fly-eye lens 65 forms multiple light-source images on a plane situated at the exit-plane side of the first fly-eye lens 65.

Referring further to FIGS. 11(a)–11(b), a first stop S1 defining a substantially circular aperture is provided at the location of the multiple light-source images produced by the first fly-eye lens 65. After passing through the aperture of the first stop S1, the light flux is condensed by a relay optical system 67 comprising first and second cylindrical relay lenses 67a and 67b, respectively, each having a different focal length in mutually perpendicular directions. The light is then incident upon a second fly-eye lens 58.

The first relay lens 67a has a focal length $f_{r1}$ in the YZ direction and the second relay lens 67b has a focal length $f_{r2}$ in the XY direction. The front focal points of the first and second relay lenses 67a, 67b are each coincident with the multiple light-source images formed by the first fly-eye lens 65. Accordingly, light from the multiple light-source images produced by the first fly-eye lens 65 is condensed within the YZ plane by the first relay lens 67a and condensed within the XY plane by the second relay lens 67b, and is then incident upon the second fly-eye lens 58. The entrance plane of the second fly-eye lens 58 is located where the multiple light-source images formed by the first fly-eye lens 65 are converged and thus superimposed on one another.

In this example embodiment, the focal lengths of the relay lenses 67a, 67b satisfy the following expression:

$$f_{r1} > f_{r2} \tag{18}$$

The transverse profile, in the XZ plane, of the light beam incident upon the second fly-eye lens 58 is rectangular, the long sides of which are in the Z direction. The X-direction dimension of the entrance plane of the second fly-eye lens 58 is denoted $D_{58x}$ and the Z-direction dimension is denoted $D_{58z}$. Because the transverse sections in the XZ plane of the respective entrance planes of the respective lens elements 65a of the first fly-eye lens 65 (whose entrance planes are conjugate to the entrance plane of the second fly-eye lens 58) are squares, the following relationship is applicable:

$$f_{r1}/f_{r2} = D_{58z}/D_{58x} \tag{17}$$

Such a configuration enables the cross-section of the light beam introduced to the second fly-eye lens 58 to be converted into a rectangular profile, even when an ordinary fly-eye lens is used as the first fly-eye lens 65.

The second fly-eye lens 58, which is identical to the fly-eye lens used in example embodiment 5, comprises a cluster of lens elements 58a. The transverse profiles of the lens elements 58a each have a dimension $L_{58x}$ in the X direction and a dimension $L_{58z}$ in the Z direction. Overall, the transverse profile of the beam passing through the cluster has a dimension $D_{58x}$ in the X direction and a dimension $D_{58z}$ in the Z direction.

Referring further to FIGS. 11(a)–11(b), multiple light-source images are formed at the exit-plane side of the second fly-eye lens 58. A second stop S2 defining a substantially elliptical aperture is situated at the location of the multiple light-source images produced by the second fly-eye lens 58. The ratio of the major and minor axes of the elliptical aperture defined by the second stop S2 is substantially equal to the ratio of the dimension $D_{58x}$ to the dimension $D_{58z}$ of the multiple light-source images formed by the second fly-eye lens 58.

Light from the multiple light-source images produced by the second fly-eye lens 58 is condensed by a condenser lens 56 having a front focal point located at the multiple light-source images. The condenser lens 56 illuminates the mask 7 telecentrically with the light-source images superimposed with respect to one another.

As discussed above, the transverse profile in the XZ plane of each lens element 65a of the first fly-eye lens 65 is square; thus, each element produces a square light-source image. The relay lenses 67a, 67b, which have mutually different focal lengths in perpendicular directions, cause the light-source images at the entrance plane of the lens elements 65a to be converted into rectangles having long sides extending in the Z direction.

The following relationship is also satisfied by example embodiment 6:

$$NA_1 > NA_2 \tag{5}$$

The illuminance E at the workpiece 8, as in the example embodiment 5, is as follows:

$$E = \pi \cdot B \cdot NA_1 \cdot NA_2 \cdot T \tag{4}$$

Since the numerical aperture $NA_2$, defined by the resolution in the pattern pitch direction, is essentially as in a conventional apparatus, the illuminance E at the workpiece 8 is increased with this example embodiment by the factor β over the illuminance achievable with a conventional apparatus.

Example embodiment 6 thus provides an apparatus having a large numerical aperture in one direction without any decrease in luminous efficiency, even though the optical system from the light source to the first fly-eye lens has a configuration similar to that found in conventional apparatus. Using example embodiment 6, illuminance at the workpiece can be increased and throughput improved without any significant reduction in resolution of the transferred pattern.

In example embodiment 6, instead of the relay optical system 67 comprising the cylindrical relay lenses 67a and 67b, a toric lens having different focal lengths in perpendicular directions can alternatively be used as the relay optical system.

Further with respect to this example embodiment, the first fly-eye lens 65 is preferably configured as a cluster of multiple lens elements 65a each having a square transverse profile. Alternatively, the first fly-eye lens 65 can comprise a cluster of multiple elements each having a rectangular transverse profile with long sides extending in the Z direction. In such an instance, the dimension in the X direction of each rectangular element would be denoted $L_{6x}$, and the dimension in the Z direction would be denoted $L_{6z}$. If the focal length of the fly-eye lens 58 is denoted $f_f$, such a relay optical system would preferably satisfy the following:

$$L_{6z}(f_{r1}/f_f) = D_{58z} \tag{18}$$

$$L_{6x}(f_{r2}/f_f) = D_{58x} \tag{19}$$

It is also possible to replace the refractive optical system of example embodiment 6 with an appropriate reflective optical system.

Example embodiments 1–6 above preferably have a numerical aperture $NA_2$ in the cross-scan direction (i.e., the short direction of the pattern features on the mask) and a numerical aperture $NA_1$ in the scan direction (the long direction of the pattern features on the mask) satisfying the following expression:

$$0.01 < NA_2/NA_1 < 1.0 \tag{20}$$

Expression (20) defines an appropriate range of ratios for the numerical apertures at the mask. Exceeding the upper limit of expression (20) would yield an inadequate illuminance at the mask, resulting in an undesirable decrease in throughput. Falling below the lower limit of expression (20) would permit an adequate illuminance at the mask, but would cause a large difference in the two numerical apertures $NA_1$, $NA_2$ in perpendicular directions. This, in turn, would require configuring the apparatus to have large differences in focal length among the elements making up the illumination optical system, and would undesirably increase the complexity of the illumination optical system.

Example Embodiment 7

Figure 13:
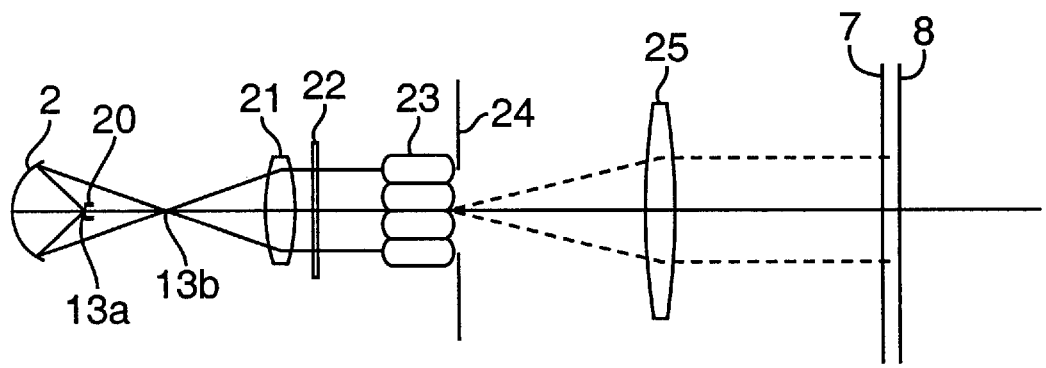
FIG. 13 schematically shows the configuration of an apparatus according to Example Embodiment 7.

This embodiment is shown in FIG. 13, and comprises a light source 20 comprising, for example, a high-pressure mercury-vapor lamp. The light source 20 is situated at the first focus point 13a of an elliptical mirror 2. Illuminant light produced by the light source 20 forms a light-source image at the second focus point 13b of the elliptical mirror 2.

Light from the light-source image is converted into substantially parallel rays by a collimating lens 21. The light then preferably passes through a filter 22 that transmits light of a proper wavelength for exposure of the workpiece 8. Light passing through the filter 22 is incident upon a fly-eye lens 23 operable to divide the light into multiple wavefronts. The fly-eye lens 23 comprises multiple lens elements 23a that collectively comprise a secondary light source comprising multiple light-source images at the location of the back focus of the fly-eye lens 23 (i.e., in the vicinity of the exit plane of the fly-eye lens 23).

Light from the multiple light-source images is restricted by an aperture stop 24 defining an aperture 24a. Light passing through the aperture 24a is incident upon a condenser lens 25. After passing through the condenser lens 25, the light from the multiple light-source images passes through the mask 7 and onto the workpiece 8. The surface of the workpiece 8 on which the light is incident is coated with a photoresist so as to form an image of the mask pattern. The pattern formed on the workpiece 8 possesses directionality as does the mask pattern.

Figure 1:
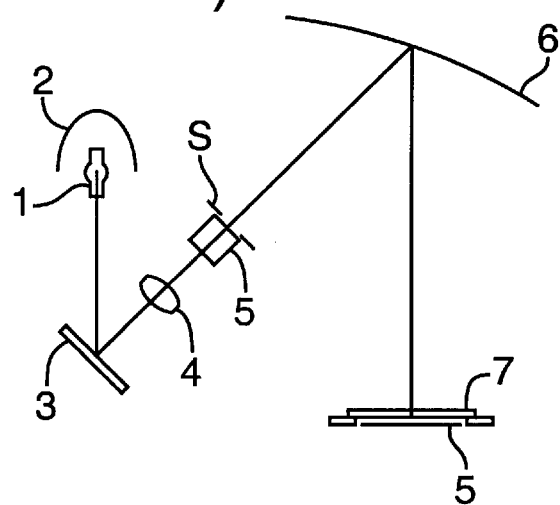
FIG. 1 schematically shows certain features of a prior art proximity-type microlithography apparatus.
Figure 2:
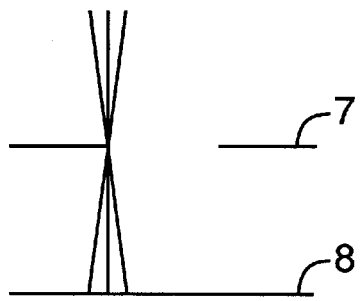
FIG. 2 depicts how resolution on the workpiece can be degraded using a prior-art proximity-type microlithography apparatus.

In order for the illuminance at the workpiece 8 to be sufficiently high, the numerical aperture NA of the light flux striking the mask 7 must be sufficiently large. However, as shown in FIG. 2, because the mask 7 and workpiece 8 are separated from each other by a certain distance ("standoff"), simply increasing the numerical aperture NA can result in an unacceptable amount of increased blurring of the pattern imprinted on the workpiece 8.

Figure 14:
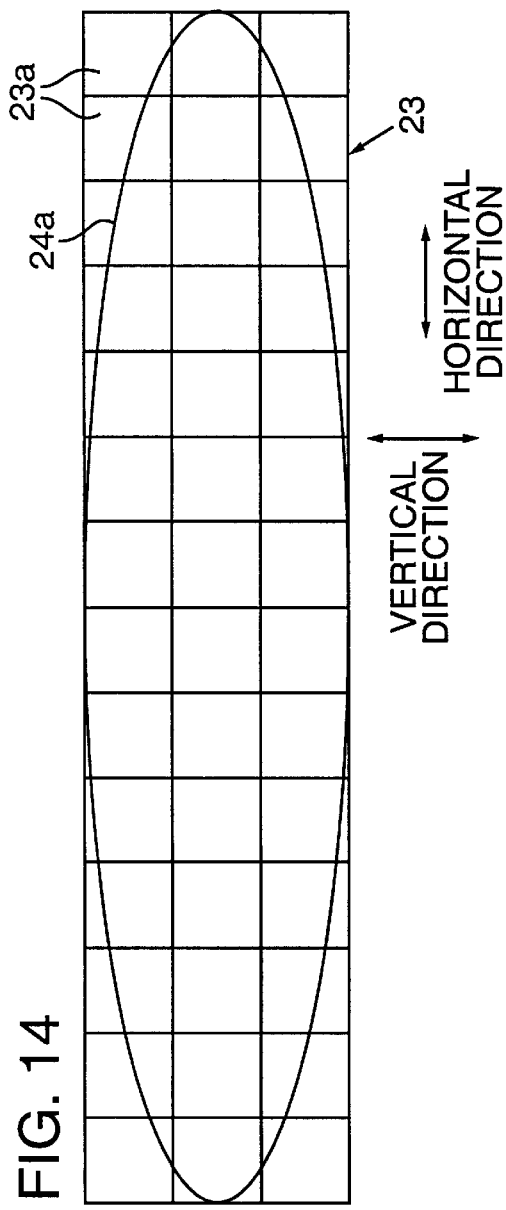
FIG. 14 shows, with respect to Example Embodiment 7, the transverse profile of the aperture defined by the aperture stop relative to the overall transverse profile of the fly-eye lens.

Whenever the mask pattern is directional, if the cross-sections of features extending in the short direction of the pattern are formed with sufficient sharpness, then the cross-sections of features extending in the long direction need not be formed quite as sharply. Thus, in this example embodiment, the aperture 24a defined by the stop 24 has an elliptical profile (FIG. 14). As can be seen in FIG. 14, the aperture 24a extends much longer in a direction corresponding to a long dimension of the mask pattern (horizontal direction in the figure) than in a direction corresponding to a short dimension of the mask pattern (vertical direction in the figure). Thus, in this example embodiment, the first illumination numerical aperture $NA_1$ (extending in the long direction of the mask pattern) is appreciably larger than the second illumination numerical aperture $NA_2$ (extending in the short direction of the mask pattern). The fly-eye lens 23 is configured to have a rectangular transverse profile that nearly circumscribes the elliptical aperture 24a. Alternatively, the aperture 24a can be rectangular to more closely match the transverse profile of the fly-eye lens 23.

The illuminance E at the mask 7 is given by $$E = \pi \cdot B \cdot NA_1 \cdot NA_2 \qquad (1)$$

As described above, the second illumination numerical aperture $NA_2$ (extending in the short direction of the mask pattern) must be set sufficiently small in order to obtain the desired resolution of the pattern transferred to the workpiece 8. Setting the first illumination numerical aperture $NA_1$ (extending in the long direction of the mask pattern) to a larger value than $NA_2$ does not significantly impair the resolution. Thus, in this example embodiment, by setting the second illumination numerical aperture $NA_2$ sufficiently small and setting the first illumination numerical aperture $NA_1$ sufficiently large, the desired illuminance can be obtained at the workpiece 8 while also obtaining the prescribed pattern resolution.

Example Embodiment 8

Figure 15:
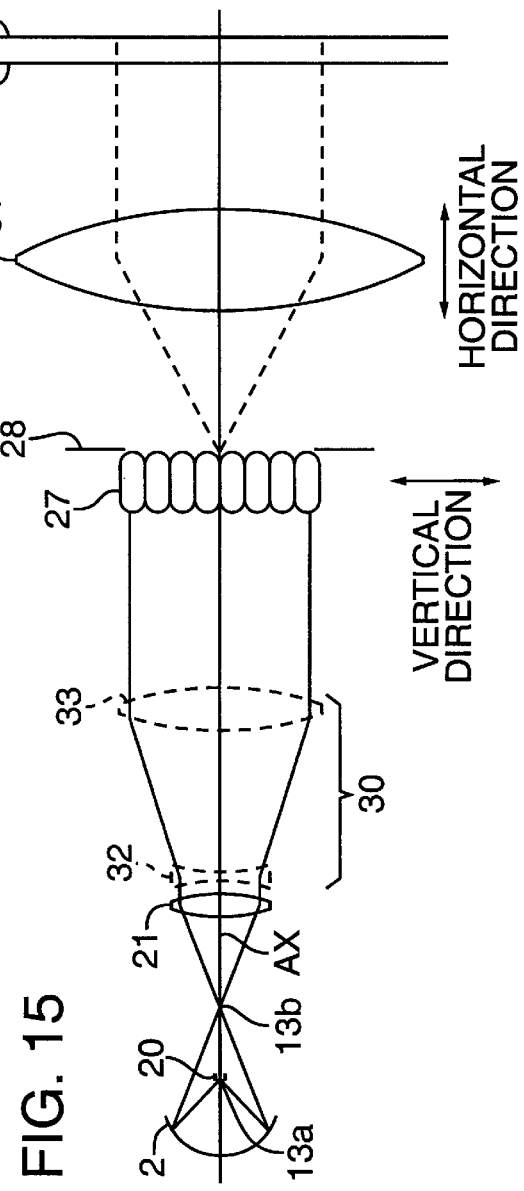
FIG. 15 schematically shows the configuration of an apparatus according to Example Embodiment 8.

FIG. 15 shows certain features of a microlithography apparatus according to example embodiment 8.

This example embodiment has certain similarities to example embodiment 7, except that example embodiment 8 employs a beam-shaping optical system 30 situated between the collimating lens 21 and the fly-eye lens 27. Thus, in FIG. 15, components that are the same as in FIG. 13 have the same reference designators.

In the apparatus of FIG. 15, the beam-shaping optical system 30 comprises first and second cylindrical lenses 32, 33. The first cylindrical lens 32 has a negative refractive power in the plane of the page of FIG. 15, and zero refractive power in the plane perpendicular to the plane of the page and including the optical axis AX. The second cylindrical lens 33 has a positive refractive power in the plane of the page and zero refractive power in the plane perpendicular to the plane of the page and including the optical axis AX. Thus, a light flux passing through the beam-shaping optical system 30 is magnified by a prescribed factor in a direction vertical to the plane of the page of FIG. 15 and acquires an elliptical cross-sectional profile substantially matching the elliptical profile of the aperture 28a defined by the aperture stop 28. Thus, in this example embodiment, light loss at the exit plane of the fly-eye lens 27 is reduced.

The beam-shaping optical system 30 is operable to make the light-source images formed at the exit plane of a fly-eye lens 27 small in the light-beam magnification direction, i.e. in a direction vertical to the plane of the page of FIG. 15. Similar to what is shown in FIG. 14, if the fly-eye lens 27 comprised lens elements 27a each having a substantially square transverse profile, then the light-source image fill factor at the exit plane of the fly-eye lens 27 could be reduced. In such an instance, the desired illuminance at the workpiece 8 would not be obtainable even if $NA_1$ were set to a large value.

Light from the fly-eye lens 27 is directed to the mask 7 through a lens 31. The lens 31 is situated apart from the exit-side image plane of the fly-eye lens 27 by an axial distance equal to the focal length of the lens 31.

Therefore, in this example embodiment, the transverse profile of each lens element 27a of the fly-eye lens 27 is rectangular (FIG. 16) rather than square so as to correspond to the shapes of the respective light-source images formed at the exit plane of the fly-eye lens 27. Each rectangular lens element 27a of the fly-eye lens 27 has a short side extending in the long direction of the mask pattern (i.e., the horizontal direction in the figure) and a long side extending in the short direction of the mask pattern (i.e., the vertical direction in the figure). Thus, in this example embodiment, the beam-shaping optical system 30 reduces light loss at the exit plane of the fly-eye lens 27 and provides a desired level of illuminance at the workpiece 8 without reducing the fill factor of the light-source image.

Example Embodiment 9

This example embodiment is identical to example embodiment 8 except that a fly-eye lens 29 having an overall transverse profile as shown in FIG. 17 is used.

In the fly-eye lens 27 of example embodiment 8 (FIG. 16), there are fewer lens elements 27a extending in the vertical direction of the figure than in the horizontal direction. As a result, nonuniformity in illuminance can occur at the mask 7 and workpiece 8 in a direction corresponding to the vertical direction in the figure. In a fly-eye lens configuration as shown in FIG. 17, the lens elements 29a that are adjacent to one another in the horizontal direction in the figure are offset in the vertical direction to increase illuminance uniformity at the mask 7 and workpiece 8.

Example Embodiment 10

This example embodiment is discussed in connection with FIG. 18. This example embodiment is configured similarly to example embodiment 7, except that example embodiment 10 employs a halogen lamp as a light source 38 and a spherical mirror 39 is used instead of an elliptical mirror. In FIG. 18, components that are the same as in example embodiment 7 have the same reference designators.

Whenever a mercury vapor lamp is employed as the light source (as in example embodiments 7 and 8), light from the light source can be condensed effectively by using an elliptical mirror. However, whenever a halogen lamp is used as the light source, as in this example embodiment, light from the light source 38 can be directly incident upon the collimating lens.

In the apparatus of FIG. 18, the light source 38 is arranged at a location offset a prescribed distance upward from the center (on the optical axis AX) of the sphere defining the surface of the mirror 39. Light emitted to the right from the light source 38 in FIG. 18 is directly incident upon the collimating lens 21. Light emitted to the left from the light source 38 is reflected by the spherical mirror 39 and forms a light-source image 40 at a location situated the prescribed offset distance downward from the center of the sphere defining the surface of the mirror 39. Thus, the light-source image 40 is formed at a location that is symmetrical (relative to the optical axis AX) to the light source 38. As a result, a single equivalent light source is formed from the light source 38 and the light-source image 40 at the center of the sphere of the mirror 39, and light from the equivalent light source on the optical axis AX is incident upon the collimating lens 21.

Example Embodiment 11

FIG. 19 depicts certain features of this example embodiment. Example embodiment 11 shares many features with example embodiment 8 (FIG. 15), except that, in example embodiment 11, an imaging lens 42 is provided in the optical path between the mask 7 and the workpiece 8. Hence, components in FIG. 19 that are the same as in FIG. 15 have the same reference designators.

The imaging lens 42 renders the plane of the mask pattern optically conjugate with the sensitive surface of the workpiece 8. This provides a significant working distance between the workpiece 8 and the mask 7.

Example Embodiment 12

Because cylindrical lenses possess lens surfaces that are cylindrical with curvature in only a single direction, machining of those lens surfaces can be difficult and thus expensive. In addition, cylindrical lenses can pose a need to correct chromatic aberration.

Thus, this example embodiment is directed to microlithography apparatus that comprise an anamorphic optical system that can be easily manufactured and that does not produce chromatic aberration.

The overall configuration of this example embodiment is shown in FIGS. 20(a)–20(c) and FIG. 21; and the apparatus functions as described above in connection with FIG. 3. FIGS. 20(a) and 20(c) are views of the XY plane, FIG. 20(b) is a view of the XZ plane, and FIG. 21 is a view of the YZ plane.

As indicated in FIG. 3, this example embodiment is a scanning-type proximity microlithography apparatus with which exposure of a workpiece 8 is conducted by illuminating a mask 7 using an illumination system 10 while the workpiece 8 is moved relative to the mask 7. The mask 7 defines a pattern that is elongated in the Z direction. The workpiece 8 can be a film coated with resist or other suitable photosensitive resin. The workpiece is conveyed at a prescribed speed in the Z direction. Because the pattern being transferred to the workpiece 8 is elongated in the Z direction, the precision with which the pattern is transferred will not be compromised even if the numerical aperture within the YZ plane of the illuminant light at the mask 7 is large.

Referring now to FIGS. 20(a)–20(c) and FIG. 21, illuminant light is produced by a light source 11 comprising, e.g., a high-pressure mercury vapor lamp. The light is condensed by an elliptical mirror 72 arranged such that its first focal point 73a is located at the light source 71, and an image of the light source is formed at the second focal point 73b of the mirror 72. Light from the light-source image is substantially collimated by a collimating optical system 74 comprising a first collimating lens 74a having refractive power only within the YZ plane and a second collimating lens 74b having refractive power only within the XY plane. The light is then incident upon a fly-eye lens 75. The first and second collimating lenses 74a, 74b are mounted such that their respective front focal points are coincident with the light-source image produced by the elliptical mirror 72. The light beam incident upon the fly-eye lens 75 has a substantially elliptical transverse profile (in the XZ plane).

Figure 22:
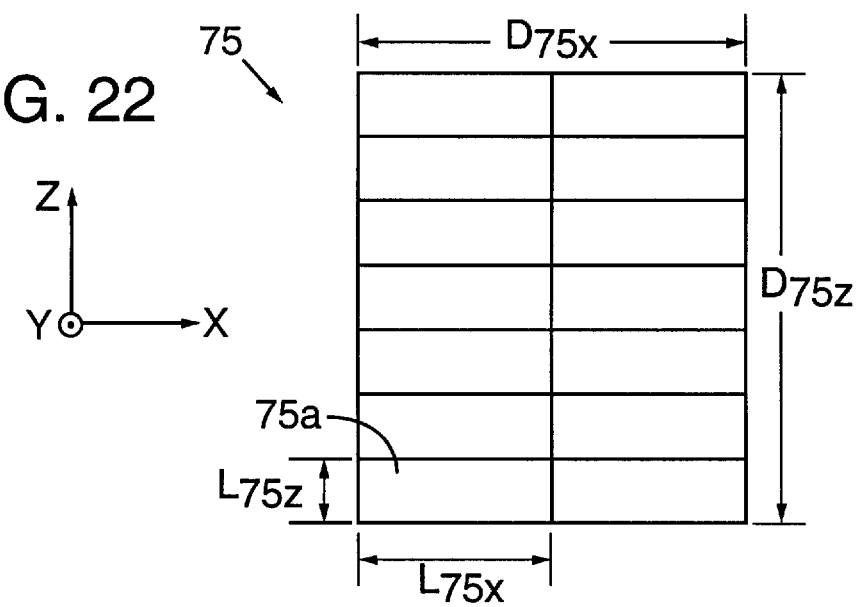
FIG. 22 shows the transverse profile of the fly-eye lens used in Example Embodiment 12.

The fly-eye lens 75, as shown in FIG. 22, comprises a cluster of multiple lens elements 75a each having a rectangular transverse section. Each lens element 75a has a dimension $L_{75x}$ in the X direction and a dimension $L_{75z}$ in the Z direction ($L_{75x} \neq L_{75z}$). The entire cluster has a rectangular transverse profile having a dimension $D_{75x}$ in the X direction and a dimension $D_{75z}$ in the Z direction ($D_{75x} \neq D_{75z}$).

The illuminant light then passes through a stop S defining a substantially elliptical aperture. The stop S is situated on the exit side of the fly-eye lens 75. The multiple light-source images produced by the respective lens elements 75a of the fly-eye lens 75 form at the plane of the aperture defined by the stop S.

Light from the multiple light-source images is incident upon a condenser lens 76. The condenser lens 76 is mounted such that its front focal point is coincident with the multiple light-source images formed by the fly-eye lens 75. A field stop FS is illuminated by the converged multiple light-source images. The field stop FS defines a substantially rectangular aperture having a long dimension extending in the Z direction.

Referring to FIG. 21, light from the field stop FS passes through a relay optical system 77 comprising first and second spherical mirrors M1, M2, respectively, and arrives at the mask 7. Light passing through the mask 7 illuminates the workpiece 8, thereby transferring the pattern defined on the mask 7 to the workpiece 8. The spherical mirrors M1, M2 are discussed in detail later below.

FIG. 21 depicts the reflection of rays from the first and second spherical mirrors M1, M2 within the meridional plane. The first spherical mirror M1 comprises a reflective surface comprising a portion of a spherical surface having a negative radius of curvature R1 about a first center of curvature C1. The second spherical mirror M2 comprises a reflective surface comprising a portion of a spherical surface having a positive radius of curvature R2 about a second center of curvature C2. The first and second spherical mirrors M1, M2 are arranged such that an axis Ax extends as a straight line from the first center of curvature C1 to the second center of curvature C2. A distance L between the first and second centers of curvature C1, C2 is approximately equal to $|R1-R2|/2^{1/2}$. The spherical mirrors M1, M2 are respectively positioned such that the field stop FS is located within a plane perpendicular to the axis Ax and including the center of curvature C1.

Of the light passing through the field stop FS, rays in the meridional plane are condensed by the first spherical mirror Ml onto the axis Ax at a first conjugate point I1 (conjugate to the field stop FS). Light from the first conjugate point I1 is condensed by the second spherical mirror M2 at a second conjugate point I2 on the mask 7. The second conjugate point I2 is conjugate to the first conjugate point I1. The field stop FS and the first conjugate point I1 are in a 1:1 magnification imaging relationship for rays within the meridional plane. The first conjugate point I1 and the second conjugate point I2 are in a 1:1 magnification imaging relationship for rays within the meridional plane. Thus, for such rays, the field stop FS is imaged on the mask 7 at a magnification of unity.

Figure 23:
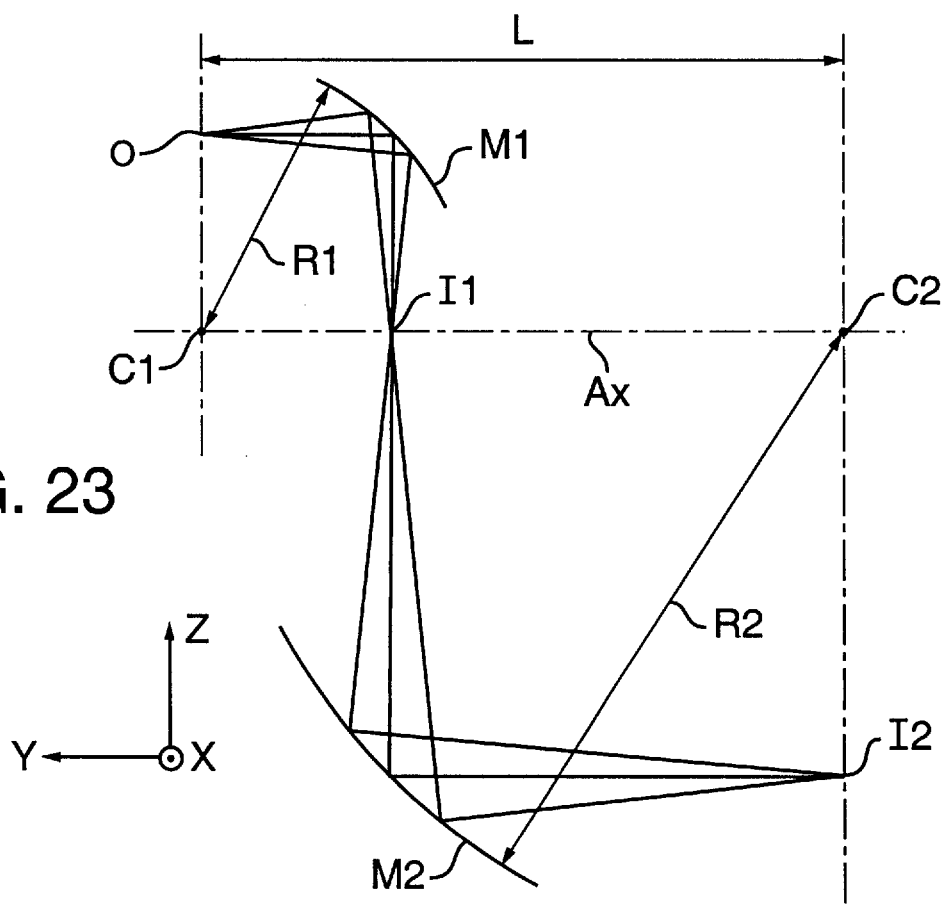
FIG. 23 shows ray trajectories within the meridional plane of light reflected from spherical mirrors comprising the relay optical system of Example Embodiment 12.
Figure 24:
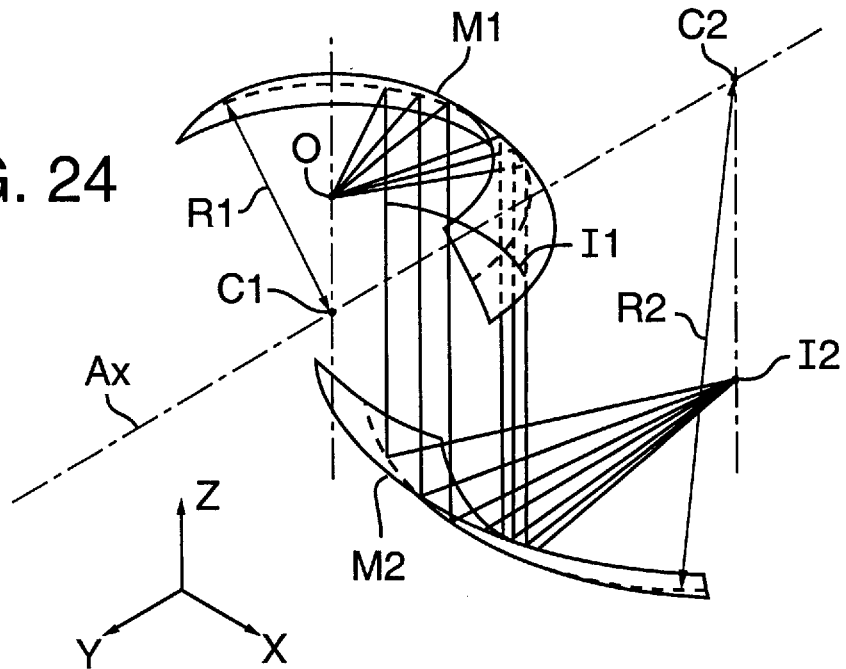
FIG. 24 shows ray trajectories within the sagittal plane of light reflected from spherical mirrors comprising the relay optical system of Example Embodiment 12.

The tracing of rays in the meridional plane is more completely shown in FIG. 23. FIG. 24 shows rays in the sagittal plane which is perpendicular to the meridional plane.

In FIG. 23, the first and second spherical mirrors M1, M2 are arranged as discussed above with respect to FIG. 21. As can be seen in FIG. 23, the axis Ax is a straight line extending between the first and second centers of curvature C1, C2 over a length L. The length L preferably satisfies the following relationship:

$$0.8L < |R1-R2|/2^{1/2} < 1.2L \quad (21)$$

Moreover, the first and second spherical mirrors M1, M2 are arranged such that the object point O (object plane) is situated within a plane perpendicular to the axis Ax and including the first center of curvature C1.

Expression (21) above defines the preferred arrangement of the first and second spherical mirrors M1, M2. Not satisfying expression (21) is undesirable because such a situation can yield an unacceptable level of aberration that would fail to produce a satisfactory image on the workpiece.

FIG. 23 illustrates the optical path of rays within a plane that includes the axis Ax and the object point O (such a plane is referred to as the "meridional plane"). Among the rays propagating from the object point O, rays within the meridional plane and having a prescribed numerical aperture are incident upon the first spherical mirror M1. The rays are reflected at about a 90° angle from the first spherical mirror M1 and converge upon the axis Ax at the image point I1 to form an image of the object point O.

The object point O is located on a plane perpendicular to the axis Ax and including the first center of curvature C1. Since the distance between the object point O and the axis Ax is approximately $|R1|/2^{1/2}$, the image I1 of the object point O is formed within the meridional plane essentially on the axis Ax at an imaging magnification of unity.

FIG. 24 shows the optical path within a plane perpendicular to the meridional plane (referred to herein as the "sagittal plane"). Among the rays propagating from the object point O, rays within the sagittal plane having a prescribed numerical aperture are reflected from the first spherical mirror M1. Because the object point O, with respect to the first spherical mirror M1, is within a plane perpendicular to the axis Ax that includes the first center of curvature C1, and because the distance between the object point O and the axis Ax is approximately $|R1|/2^{1/2}$, divergent rays from the object point O within the sagittal plane form a substantially collimated light beam within the sagittal plane.

Accordingly, within the plane including the axis Ax and that is perpendicular to a straight line extending between the object point O and the first center of curvature C1, the image I1 of the object point O is splayed out in an arc that is concave as viewed from aside the center of curvature C1.

Referring further to FIG. 23, among the rays propagating from the image I1, rays propagating within the meridional plane are incident upon the second spherical mirror M2 with the same numerical aperture as that of the rays propagating from the object point O to the first spherical mirror M1. The rays are reflected about 90° by the second spherical mirror M2 and converge onto a plane perpendicular to the axis Ax. Thus, within the meridional plane, the second spherical mirror M2 forms a secondary image I2 of the object point O.

Within the meridional plane, the object point of the second spherical mirror M2 is I1. Because the image I1 is located approximately within a plane (including the second center of curvature C2) perpendicular to straight line extending between the second center of curvature C2 and the secondary image I2, and because the distance between the image I1 and the second center of curvature C2 is approximately $|R2|/2^{1/2}$, the secondary image I2 (which is an image of the image I1) has a magnification of unity within the meridional plane. Also, the numerical aperture of the rays propagating from the second spherical mirror M2 toward the secondary image I2 is the same as the numerical aperture of the rays propagating from the object point O to the first spherical mirror M1.

Referring further to FIG. 24, light from the image I1 propagates toward the second spherical mirror M2 as a collimated beam within the sagittal plane. The second spherical mirror M2 bends this collimated beam by about 90°. The beam is condensed onto a plane perpendicular to the axis Ax and including the second center of curvature C2. As a result, the image magnification along the optical path within the sagittal plane is $|R2/R1|$.

Hence, the first and second spherical mirrors M1, M2 collectively perform imaging at a magnification of unity within the meridional plane. The magnification within the sagittal plane is dependent upon the ratio of R1 to R2. As a result, a desired magnification ratio can be obtained in mutually perpendicular cross-sections (i.e., the meridional plane versus the sagittal plane) by varying the ratio of R1 to R2. Furthermore, because the mirrors M1, M2 eliminate the need for refractive optical members (which can generate chromatic aberration), chromatic aberration is not generated, in principle, in this example embodiment. Moreover, this example embodiment is easy to manufacture due in part to the ease of machining the spherical mirrors M1, M2.

FIGS. 20(a)–20(c) depict the trajectories of rays in the sagittal plane. In the sagittal plane, the axis Ax overlaps the optical axis of the illumination optical system comprising the light source 71 through the condenser lens 76. Rays propagating in the sagittal plane in the -Y direction converge at the field stop FS and diverge downstream of the field stop to reflect from the first spherical mirror M1.

The first spherical mirror M1 reflects the rays in the -Z direction and also substantially collimates the rays (FIG. 20(b)). The substantially collimated beam is reflected in the -Y direction by the second spherical mirror M2 which also condenses the rays onto the mask 7. At the mask, the image magnification ratio within the sagittal plane is |R2/R1|.

Among the rays illuminating the field stop FS, the numerical aperture of the meridional rays is larger than the numerical aperture of the sagittal rays. Because the first and second spherical mirrors M1, M2 perform imaging at a magnification of unity within the meridional plane, the numerical aperture of the meridional rays is preserved. The numerical aperture of the sagittal rays is a function of the ratio of the radius of curvature R1 of the first spherical mirror M1 and the radius of curvature of the second spherical mirror M2. Since $|R1|<|R2|$ in this example embodiment, the numerical aperture $NA_2$ of the sagittal rays is further reduced at the mask 7. If the numerical aperture of the meridional rays is $NA_1$, the following expression is satisfied:

$$NA_1 > NA_2 \quad (5)$$

The numerical aperture $NA_2$, defined by the resolution in the pattern pitch direction, is set to be about the same as in a conventional proximity microlithography apparatus. The numerical aperture $NA_1$ is increased in this example embodiment over that of conventional apparatus. The illuminance E at the workpiece W is given by the following:

$$E = \pi \cdot B \cdot NA_1 \cdot NA_2 \quad (1)$$

wherein B is the luminance of the light source 71. Thus, the illuminance at the mask is increased by the factor $NA_1/NA_2$.

Since the mask pattern is elongated in a prescribed direction wherein $NA_1$ in the prescribed direction is larger than $NA_2$ in a direction perpendicular to the prescribed direction, the illuminance at the workpiece 8 is increased and throughput improved with no decrease in pattern-transfer resolution.

Example Embodiment 13

In the example embodiment of FIGS. 23 and 24, the first spherical mirror M1 causes light from the object point O to assume an arc-like profile in the sagittal plane that includes the image point I1. Because the second spherical mirror M2 causes further enlargement of the arc-like profile, it is possible for rays arriving at the secondary image point I2 to exhibit aberration.

Figure 25:
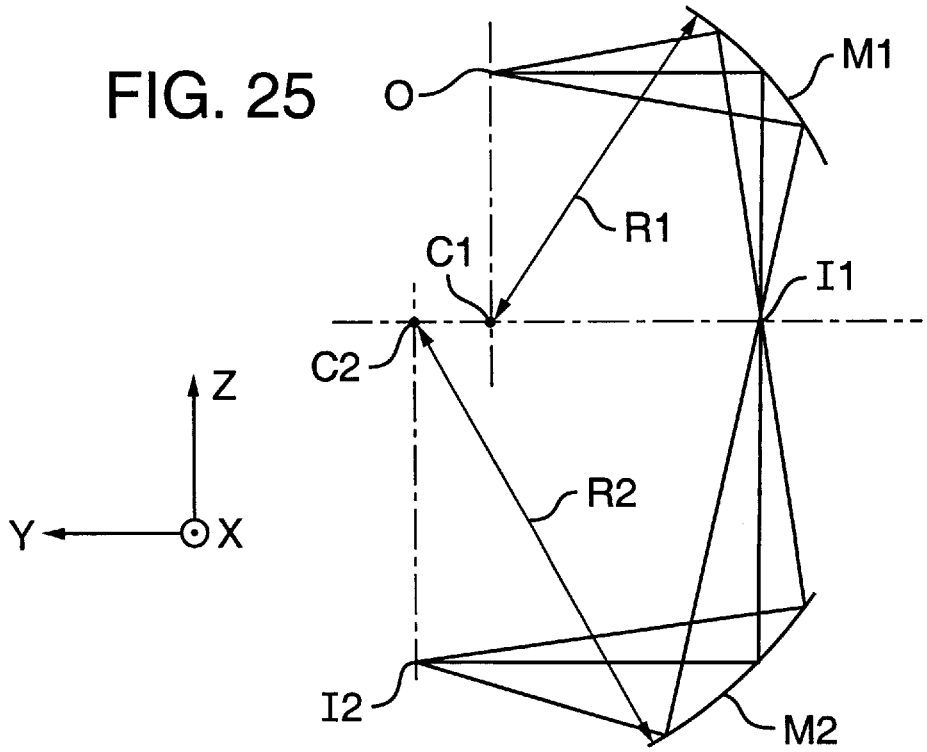
FIG. 25 shows ray trajectories in the optical-relay portion of Example Embodiment 13.

This example embodiment prevents any aberrations arising as summarized above. (This example embodiment is the same as example embodiment 12 except for the altered arrangement of the first and second spherical mirrors M1, M2 shown in FIG. 25.) Referring to FIG. 25, if the center of curvature C1 of the first spherical mirror M1 and the center of curvature C2 of the second spherical mirror M2 are situated on the same side of line segments respectively drawn between the first spherical mirror M1 and the second spherical mirror M2 (i.e., if the radii of curvature R1, R2 are made to have the same sign), then any aberrations imparted by the first spherical mirror M1 and aberrations imparted by the second spherical mirror M2 are mutually canceled. Such a configuration allows for reduced aberrations at the second image point I2.

In both example embodiments 12 and 13, manufacturing is simplified because (1) the optical members making up the illumination optical system can all be constituted from optical elements that are rotationally symmetrical with respect to the optical axis of the system, and (2) optical members on the mask side of the fly-eye lens 75 are rotationally symmetrical.

Example embodiments 12 and 13 are configured such that exposure occurs by scanning. Although scanning can result in the mask being exposed to an illumination beam having an arc-like cross-sectional profile, this is not a problem. If a rectangular cross-sectional profile is desired, the shape of the aperture defined by the field stop FS can be suitably changed.

Also, in example embodiments 12 and 13, the field stop FS is situated at a location conjugate to the mask 7. A representative field stop FS is shown in FIG. 26, indicating that the aperture width in the Z direction can be made variable over the X direction to allow adjustment of exposure value.

The field stop FS of FIG. 26 comprises a frame member FSa and a movable portion FSb. The movable portion FSb comprises multiple segments that can be adjusted relative to each other in the Z direction. Thus, the shape of the aperture defined by the field stop FS can be changed by changing the width in the Z direction as a function of the X coordinate.

If nonuniformity in illuminance should occur in the cross-scan direction at the mask 7, the width of the illumination region in the scan direction can be changed so that a constant cumulative exposure value at the workpiece 8 is attained or maintained. A variety of interchangeable field stops can be selectably utilized each defining a differently shaped aperture.

With respect to example embodiments 12 and 13, the numerical aperture $NA_1$ in the scan direction (the long direction of the mask pattern) and the numerical aperture $NA_2$ in the cross-scan direction (the short direction of the mask pattern) preferably satisfy the relationship:

$$0.01 < NA_2/NA_1 < 1.0 \quad (20)$$

Exceeding the upper limit of expression (20) in this embodiment would prevent an adequate increase in illuminance at the mask 7, which could result in an undesirable decrease in throughput. Falling below the lower limit would permit an adequate increase in the illuminance at the mask; but, such a situation is undesirable because the resulting large difference in numerical apertures in perpendicular directions would require large differences in focal length among the elements making up the illumination optical system. Such a condition could undesirably increase the complexity of the illumination optical system.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A microlithography apparatus for forming an image of a mask pattern on a photosensitive substrate, the apparatus comprising an illumination optical system for illuminating a planar mask defining a pattern, the illumination optical system comprising a first illumination numerical aperture in a first direction in the plane of the mask pattern and a second illumination numerical aperture in a second direction, orthogonal to the first direction, in the plane of the mask pattern, the first numerical aperture being different from the second numerical aperture.

2. The apparatus of claim 1, wherein the mask pattern defines features having a long direction and a short direction, the first numerical aperture extending in the long direction of the mask pattern and the second numerical aperture extending in the short direction of the mask pattern, the first numerical aperture being larger than the second numerical aperture.

3. The apparatus of claim 2, wherein the illumination optical system further comprises:

(a) a light source operable to produce an illumination light flux;

(b) a fly-eye lens situated axially downstream of the light source and comprising multiple lens elements, the fly-eye lens being operable to produce from the illumination light flux multiple light-source images;

(c) a stop situated axially downstream of the fly-eye lens, the stop defining an aperture through which light from the multiple light-source images passes; and (d) a condenser lens axially downstream of the stop for condensing light passing through the aperture onto the mask.

4. The apparatus of claim 3, wherein the aperture has a transverse profile including a longer dimension and a shorter dimension orthogonal to the longer dimension, the longer dimension being aligned with the long dimension of the features defined by the mask and the shorter dimension being aligned with the short dimension of the features defined by the mask.

5. The apparatus of claim 4, wherein the fly-eye lens has an overall transverse profile having a long dimension and a short dimension orthogonal to the long dimension, the long dimension of the fly-eye lens being aligned with the long dimension of the features defined by the mask and the short dimension of the fly-eye lens being aligned with the short dimension of the features defined by the mask.

6. The apparatus of claim 5, wherein the fly-eye lens has a rectangular transverse profile.

7. The apparatus of claim 4, further comprising a beam-shaping optical system for shaping the illumination light flux from the light source in accordance with the transverse profile of the aperture.

8. The apparatus of claim 7, wherein the fly-eye lens comprises multiple parallel axially extending lens elements, each lens element having a rectangular transverse profile with short sides extending in a direction corresponding to the long dimension of the features defined by the mask and long sides extending in a direction corresponding to the short dimension of the features defined by the mask.

9. The apparatus of claim 1, operable to perform exposure of the substrate with the mask placed in proximity to the substrate.

10. The apparatus according to claim 3, further comprising an imaging optical system operable to place the mask pattern conjugate to a photosensitive surface of the substrate, the imaging optical system being axially situated between the mask and the substrate.

11. A scanning proximity-type microlithography apparatus, comprising an illumination optical system for illuminating a planar mask defining a pattern and for forming an image of the mask pattern on a photosensitive surface of a workpiece, the illumination optical system being situated along an optical axis, and having a first workpiece-side illumination numerical aperture $NA_1$ oriented in a first direction transverse to the optical axis and a second workpiece-side illumination numerical aperture $NA_2$ oriented in a second direction transverse to the optical axis and orthogonal to the first direction, the first numerical aperture being different from the second numerical aperture.

12. The apparatus of claim 11, wherein the mask pattern defines features having a long direction and a short direction, the first numerical aperture extending in the long direction of the mask pattern and the second numerical aperture extending in the short direction of the mask pattern, and the first numerical aperture being larger than the second numerical aperture.

13. The apparatus of claim 12, wherein the illumination optical system is operable to form an illumination light flux having a transverse profile that is longer in the second direction than in the first direction.

14. The apparatus of claim 13, operable to scan the mask and workpiece in the first direction during exposure of the mask pattern onto the photosensitive surface of the workpiece.

15. The apparatus of claim 14, wherein the illumination optical system further comprises:

(a) an illumination light source operable to produce an illumination light flux;

(b) a fly-eye lens axially situated downstream of the illumination light source to allow the illumination light flux to pass through the fly-eye lens and produce multiple light-source images; and (c) a condenser optical system axially situated downstream of the fly-eye lens to condense light from the multiple light-source images, the condenser optical system having a first focal length $f_{con1}$ in the first direction and a second focal length $f_{con2}$ in the second direction, wherein $f_{con1} \neq f_{con2}$.

16. The apparatus of claim 14, wherein the illumination optical system further comprises:

(a) an illumination light source operable to produce an illumination light flux;

(b) a collimating optical system axially situated downstream of the illumination light source and operable to form the illumination light flux into a substantially collimated light beam having a first focal length $f_{col1}$ in the first direction and a second focal length $f_{col2}$ in the second direction, wherein $f_{col1} \neq f_{col2}$;

(c) an optical integrator situated axially downstream of the collimating optical system so as to form the substantially collimated light beam into multiple light-source images; and (d) a condenser optical system situated axially downstream of the optical integrator so as to condense light from the multiple light-source images onto the mask, the condenser optical system having a first focal length $f_{con1}$ in the first direction and a second focal length $f_{con2}$ in the second direction, wherein $f_{con1} \neq f_{con2}$.

17. The apparatus of claim 16, wherein:

$f_{col1} > f_{col2}$ $f_{con1} < f_{con2}$.

18. The apparatus of claim 14, wherein the illumination optical system further comprises:
   (a) an illumination light source operable to produce an illumination light flux;
   (b) a first optical integrator axially situated downstream of the illumination light source so as to produce from the illumination light flux a first array of multiple light-source images;
   (c) a second optical integrator axially situated downstream of the first optical integrator so as to form from the first array of light-source images a second array of light-source images, the second optical integrator having an exit plane with a first dimension extending in the first direction and a second dimension, different from the first dimension, extending in the second direction; and
   (d) a condenser optical system situated axially downstream of the second optical integrator, the condenser optical system being operable to condense light from the second array of light-source images.

19. The apparatus of claim 18, wherein:

$0.01 < NA_2/NA_1 < 1.0$.

20. A proximity exposure method for transferring a pattern defined by a mask to a sensitized surface of a workpiece disposed, in proximity relationship to the mask, a standoff distance from the mask, the method comprising the steps:
   (a) providing an illumination light flux with a first workpiece-side numerical aperture $NA_1$ in a scanning direction and with a second workpiece-side numerical aperture $NA_2$ in a cross-scan direction, wherein $NA_1 > NA_2$; and
   (b) illuminating the mask with the illumination light flux to transfer the mask pattern to the sensitized surface of the workpiece.

21. The method of claim 20, wherein, during step (b), the mask and the workpiece are moved relative to each other in the scanning direction.

22. The method of claim 20, wherein:
   the mask has features elongated in a first direction, and
   step (b) comprises illuminating the mask while the first direction of the mask is aligned with the scanning direction.

23. The method of claim 22, wherein, in step (b), the mask is illuminated with an illumination light flux having a transverse profile that is shorter in the first direction than in a second direction orthogonal to the first direction.

24. A proximity-type microlithography apparatus for forming an image of a mask pattern on a photosensitive substrate, the apparatus comprising an illumination optical system for illuminating a planar mask defining a pattern, the illumination optical system comprising a relay optical system comprising first and second spherical mirrors, the first spherical mirror being situated so as to condense meridional rays, in a light flux propagating from an object point, at a point conjugate to the object point, and to substantially collimate sagittal rays in the light flux propagating from the object point, and the second spherical mirror being situated so as to condense at a single image point the meridional rays propagating from the conjugate point and the substantially collimated sagittal rays.

25. A proximity-type microlithography apparatus for transferring a pattern from a mask to a workpiece separated from the mask by a standoff, the apparatus comprising:
   (a) an illumination optical system for directing an illumination light flux along a first axis to illuminate a region on a plane conjugate to the mask and transverse to the first axis; and
   (b) a relay optical system for re-imaging on the mask the region illuminated by the illumination optical system, the relay optical system comprising a first spherical mirror having a first center of curvature and a radius of curvature R1, and a second spherical mirror having a second center of curvature and a radius of curvature R2, the first and second centers of curvature being situated on a straight second axis, and the illuminated region being situated in a plane transverse to the second axis and including the first center of curvature, the first and second centers of curvature being separated from each other on the second axis by a distance equal to $|R1-R2|/2^{1/2}$.

26. The apparatus of claim 25, wherein the first axis is parallel to the second axis.

27. The apparatus of claim 25, wherein the first center of curvature is separated from the second center of curvature on the second axis by a distance L, wherein:

$0.8L < |R1-R2|/2^{1/2} < 1.2L$.

28. The apparatus of claim 25, further operable to impart relative scanning of the mask and workpiece in a scan direction during transfer of the mask pattern to the workpiece.

29. The apparatus of claim 28, wherein the relay optical system has a workpiece-side numerical aperture in the scan direction and a workpiece-side numerical aperture in a cross scan direction perpendicular to the scan direction, the numerical aperture in the scan direction being different from the numerical aperture in the cross-scan direction.

30. A reflection optical system, comprising:
   (a) a first spherical mirror positioned so as to condense meridional rays, in a light flux propagating from an object point, at a point that is conjugate to the object point, and to substantially collimate sagittal rays in the light flux propagating from the object point; and
   (b) a second spherical mirror positioned so as to condense the meridional rays propagating from the conjugate point and the substantially collimated sagittal rays at an image point.

31. The reflection optical system of claim 30, wherein:
   each of the first and second spherical mirrors has a respective curved reflective surface and a respective center of curvature,
   the centers of curvature are situated on a linear axis,
   the object point is situated in a plane perpendicular to the axis and including the center of curvature of the first spherical mirror, and
   each of the first and second spherical mirrors has a respective radius of curvature R1, R2, wherein R1<R2.

32. The reflection optical system of claim 31, wherein R1 and R2 are negative when each respective center of curvature is on the object side of the respective curved surface.

33. The reflection optical system of claim 31, wherein the first and second centers of curvature are separated from each other on the axis by a distance L, the reflection optical system further satisfying the relationship:

$0.8L < |R1-R2|/2^{1/2} < 1.2L$.

34. The reflection optical system of claim 31, wherein each of the first and second spherical mirrors has a respective radius of curvature R1, R2, respectively, wherein R1<R2.

35. A microlithography apparatus for forming an image of a mask pattern on a photosensitive substrate, the apparatus comprising:

(a) an illumination optical system for producing a light flux for illuminating a mask; and (b) a projection optical system situated downstream of the illumination optical system, wherein a light flux from the illumination optical system passes through the mask, then through the projection optical system to a photosensitive substrate, the light flux having a first numerical aperture in a first direction and a second numerical aperture in a second direction orthogonal to the first direction, the first numerical aperture being different from the second numerical aperture.

36. The apparatus of claim 35, wherein the first numerical aperture is larger than the second numerical aperture.

37. The apparatus of claim 36, wherein at least one of the mask and substrate is movable.

38. A microlithography method, comprising:

(a) illuminating a mask pattern with a light flux;

(b) projecting the light flux, carrying an image of the illuminated mask pattern, from the mask onto on a photosensitive substrate, the light flux having a first numerical aperture in a first direction and a second numerical aperture in a second direction orthogonal to the first direction, the first numerical aperture being different from the second numerical aperture.

39. The method of claim 38, wherein the first numerical aperture is larger than the second numerical aperture.

40. The method of claim 39, wherein at least one of the mask and substrate moves when projecting the image of the mask pattern onto the photosensitive substrate.

\* \* \* \* \*

UNITED STATES PATENT AND TRADEMARK OFFICE
CERTIFICATE OF CORRECTION

PATENT NO. : 5,891,806

DATED : April 6, 1999

INVENTOR(S) : Shibuya et al.

It is certified that error appears in the above-identified patent and that said Letters Patent is hereby corrected as shown below:

Column 3, line 22, "NA" should be --$NA_1$--.

Column 3, line 54, a period --.-- should be inserted after --($f_{col1} \neq f_{col2}$)--.

Column 12, line 7, "$f_{con2}$" should be --$f_{col2}$--.

Column 15, line 38, a comma --,-- should be inserted between "$D_{58x}$" and "and".

Column 15, line 45, "(17)" should be --(19)--.

Column 16, line 55, "(18)" should be --(20)--.

Column 16, line 56, "(19)" should be --(21)--.

Column 16, line 67, "(20)" should be --(22)--.

Column 17, line 1, "(20)" should be --(22)--.

Column 17, line 3, "(20)" should be --(22)--.

Column 17, line 5, "(20)" should be --(22)--.

Column 21, line 56, "(21)" should be --(23)--

UNITED STATES PATENT AND TRADEMARK OFFICE
CERTIFICATE OF CORRECTION

PATENT NO. : 5,891,806

DATED : April 6, 1999

INVENTOR(S) : Shibuya et al.

It is certified that error appears in the above-identified patent and that said Letters Patent is hereby corrected as shown below:

Column 21, line 61, "(21)" should be --(23)--.

Column 21, line 63, "(21)" should be --(23)--.

Column 24, line 52 (specification page 54, line 1), "(20)" should be --(22)--.

Column 24, line 53, "(20)" should be --(22)--.

In the Claims:

Column 30, line 7, claim 38, "on" should be deleted.

Signed and Sealed this

Ninth Day of May, 2000

Attest:

Q. TODD DICKINSON

Attesting Officer

Director of Patents and Trademarks